(12) United States Patent
Lu

(10) Patent No.: US 8,685,801 B2
(45) Date of Patent: Apr. 1, 2014

(54) METHOD OF MANUFACTURING SEMICONDUCTOR DEVICE

(71) Applicant: Fuji Electric Co., LTD., Kawasaki (JP)

(72) Inventor: Hong-fei Lu, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/737,302

(22) Filed: Jan. 9, 2013

(65) Prior Publication Data

US 2013/0122663 A1 May 16, 2013

Related U.S. Application Data

(63) Continuation of application No. PCT/JP2010/063702, filed on Aug. 12, 2010.

(51) Int. Cl.
*H01L 21/332* (2006.01)

(52) U.S. Cl.
USPC .................................. 438/138; 257/E21.002

(58) Field of Classification Search
USPC .................................. 438/138; 257/E21.002
See application file for complete search history.

(56) References Cited

U.S. PATENT DOCUMENTS

| | | | |
|---|---|---|---|
| 4,881,107 A | 11/1989 | Matsushita | |
| 5,141,889 A * | 8/1992 | Terry et al. | 438/138 |
| 5,541,122 A | 7/1996 | Tu et al. | |
| 6,194,290 B1 * | 2/2001 | Kub et al. | 438/455 |
| 6,924,177 B2 * | 8/2005 | Schulze et al. | 438/133 |
| 2004/0063302 A1 | 4/2004 | Takahashi et al. | |
| 2005/0029568 A1 | 2/2005 | Tokuda et al. | |
| 2006/0038206 A1 | 2/2006 | Shimoyama et al. | |
| 2010/0127306 A1 * | 5/2010 | Okuda et al. | 257/139 |

FOREIGN PATENT DOCUMENTS

| | | |
|---|---|---|
| JP | 64-45159 A | 2/1989 |
| JP | 04-096379 A | 3/1992 |
| JP | 4-242976 A | 8/1992 |
| JP | 4-242980 A | 8/1992 |
| JP | 6-224290 A | 8/1994 |
| JP | 2004-165619 A | 6/2004 |
| JP | 2005-093972 A | 4/2005 |

(Continued)

OTHER PUBLICATIONS

Himi et al, "Silicon Wafer Direct Bonding without Hydrophilic Native Oxides", Japanese Journal of Applied Physics; Jan. 2004; pp. 6-10; vol. 33 Part I, No. 3A.*

(Continued)

*Primary Examiner* — William D Coleman
*Assistant Examiner* — Christine Enad
(74) *Attorney, Agent, or Firm* — Rossi, Kimms & McDowell LLP

(57) ABSTRACT

Mirror-polished CZ wafer and FZ wafer are prepared. A first impurity region which will be a first isolation region is formed in a surface layer of a first main surface of the CZ wafer. The first main surface of the CZ wafer and a first main surface of the FZ wafer are bonded to each other by an inter-molecular bond. A second impurity region which will be a second isolation region is formed in a surface layer of a second main surface of the FZ wafer. A heat treatment is performed to diffuse the first impurity region and the second impurity region such that the first impurity region and the second impurity region are continuous, thereby forming a through silicon isolation region.

19 Claims, 32 Drawing Sheets

(56) References Cited

FOREIGN PATENT DOCUMENTS

| JP | 2006-303410 A | 11/2006 |
|---|---|---|
| JP | 4232645 B2 | 12/2008 |
| JP | 2010-003899 A | 1/2010 |

OTHER PUBLICATIONS

International Search Report issued Nov. 16, 2010 for parent PCT/JP2010/063702.

Shimoyama, et al., "A New Isolation Technique for Reverse Blocking IGBT with Ion Implantation and Laser Annealing to Tapered Chip Edge Sidewalls", Proceedings of the 18th International Symposium on Power Semiconductor Devices and IC's, Jun. 4-8, 2006, pp. 29-32, Naples, Italy.

Nakagawa, et al., "1800V Bipolar-Mode MOSFETs: A First Application of Silicon Wafer Direct Bonding (SDB) Technique to a Power Device", CH2381-2/86/0000-0122, 1986 IEEE, vol. 32, pp. 122-125.

* cited by examiner

US 8,685,801 B2

METHOD OF MANUFACTURING SEMICONDUCTOR DEVICE

BACKGROUND OF THE INVENTION

A. Field of the Invention

The present invention relates to a method of manufacturing a semiconductor device.

B. Description of the Related Art

A discrete semiconductor with a high breakdown voltage plays an important role in a power conversion device. For example, an insulated gate bipolar transistor (IGBT) or an insulated gate field effect transistor (MOSFET) has been known as a discrete semiconductor. In particular, since the IGBT has the property that an on voltage is reduced by conductivity modulation, it is applied to a case in which power conversion is required at a high voltage.

In recent years, a reverse blocking IGBT (RB-IGBT) has been developed which has a termination structure in which a high breakdown voltage (hereinafter, referred to as a reverse breakdown voltage) is obtained when a reverse bias is applied to a pn junction including a collector region and a drift region of the IGBT. For example, the reverse blocking IGBT has started to be applied to an AC (alternating current)/AC direct conversion device.

FIG. 26 is a cross-sectional view illustrating the reverse blocking IGBT according to the related art. The reverse blocking IGBT illustrated in FIG. 26 includes active region 100 in which an element structure of an IGBT is formed in n⁻ wafer 101 which will be an n⁻ drift region and breakdown voltage structure 110 which surrounds active region 100. In active region 100, for example, a surface element structure of a planar-gate-type IGBT including a p base region or an n⁺ emitter region, a gate electrode, and an emitter electrode is formed in the first main surface of wafer 101. P collector region 102 is provided on the entire second main surface of wafer 101. Collector electrode 103 comes into contact with p collector region 102.

In breakdown voltage structure 110, a plurality of p-type regions 111 and a plurality of conductive films 112 which come into contact with p-type regions 111 are provided in the first main surface of wafer 101. A p-type isolation region (hereinafter, referred to as a through silicon isolation region) 121 is provided at outer circumferential end 120 of wafer 101 such that it extends from the first main surface of wafer 101 to the drift region and comes into contact with p collector region 102. Isolation region 121 surrounds breakdown voltage structure 110. Breakdown voltage structure 110 and outer circumferential end 120 (termination structure) surround active region 100.

For example, isolation region 121 of the reverse blocking IGBT is formed as follows. First, p-type impurities are implanted from the first main surface of wafer 101. Then, a heat treatment is performed for a long time to diffuse the implanted p-type impurities deep into the second main surface of wafer 101. In this way, isolation region 121 obtained by diffusing the p-type impurities is formed. Then, wafer 101 is ground from the second main surface of wafer 101 such that isolation region 121 is exposed. In this way, isolation region 121 which extends from the first main surface to the second main surface of wafer 101 is formed.

As a method of forming the isolation region of the reverse blocking IGBT, the following method has been proposed. An n⁻ silicon substrate has a bottom and an upper surface which are opposite to each other. A p-type impurity diffusion layer is formed at a high concentration on the entire bottom of the n⁻ silicon substrate by the diffusion of the p-type impurities. In addition, a p-type isolation region is partially formed in the upper surface of the n⁻ silicon substrate by the diffusion of the p-type impurities. The p-type isolation region has a bottom which reaches the upper surface of the p-type impurity diffusion layer (for example, see JP 2004-165619 A).

FIG. 27 is a cross-sectional view illustrating another example of the reverse blocking IGBT according to the related art. In the reverse blocking IGBT illustrated in FIG. 27, p-type isolation region 130 is provided along the side wall of a trench which extends from the first main surface of wafer 101 to p collector region 102 and is connected to p collector region 102. The trench surrounds active region 100 and breakdown voltage structure 110 of wafer 101. The trench is filled with filler 131.

As a method of forming the isolation region with the trench structure, the following method has been proposed in which a step of forming a first impurity region of a second conduction type in a second main surface of a semiconductor substrate which is a first conduction type and has a first main surface and the second main surface opposite to the first main surface, a step of forming a trench which extends from the first main surface to the first impurity region in a peripheral region of the semiconductor substrate using anisotropic etching, and a step of introducing second-conduction-type impurities from the side wall of the trench to the semiconductor substrate using ion implantation to form a second impurity region are sequentially performed (for example, see JP 2005-093972 A).

FIG. 28 is a cross-sectional view illustrating another example of the reverse blocking IGBT according to the related art. In the reverse blocking IGBT illustrated in FIG. 28, active region 100 and breakdown voltage structure 110 are provided in wafer 101. Isolation region 122 is provided in a first main surface of outer circumferential end 120 of wafer 101. In addition, concave portion 123 which extends from a second main surface to the first main surface through isolation region 122 is provided at outer circumferential end 120 of wafer 101.

The angle between the side wall of concave portion 123 and the second main surface of wafer 101 is, for example, 54.7°. That is, outer circumferential end 120 of wafer 101 is thinner than active region 100. P collector region 102 and p-type region 124 are provided in the second main surface of wafer 101 and the side wall of concave portion 123. Isolation region 122 is connected to p collector region 102 through p-type region 124.

For example, the reverse blocking IGBT illustrated in FIG. 28 is manufactured as follows. First, the first main surface of wafer 101 is a (100) plane and isolation region 122, the surface element structure of the reverse blocking IGBT, and the breakdown voltage structure are formed on the first main surface of wafer 101. Then, wafer 101 is thinned to a predetermined thickness from the second main surface of wafer 101.

Then, concave portion 123 which extends from the second main surface of wafer 101 to isolation region 122 is formed by photolithography. For example, concave portion 123 is formed by wet etching such that the angle between the side wall of concave portion 123 and the second main surface of wafer 101 is, for example, 54.7°. Then, a resist mask for forming concave portion 123 is removed. Then, ion implantation and laser annealing are performed to form p collector region 102 and p-type region 124 in the second main surface of wafer 101 and the side wall of concave portion 123.

As a method of forming the isolation region in the semiconductor wafer in which the outer circumferential end is thinner than the active region, the following method has been proposed. The surface of a thin semiconductor wafer in which a surface structure forming a semiconductor chip is formed is attached to a supporting substrate by a double-sided adhesive tape. Then, a trench to be a scribe line is formed from the rear surface of the thin semiconductor wafer by wet anisotropic etching, with the crystal plane thereof being exposed. Then, an isolation layer which maintains a reverse breakdown voltage is formed on the side of the trench whose crystal plane is exposed by ion implantation and low-temperature annealing or laser annealing at the same time as a p collector region, which is a rear diffusion layer, is formed (for example, see JP 2006-303410 A and Kazuo Shimoyama and five others, "A New Isolation Technique for Reverse Blocking IGBT with Ion Implantation and Laser Annealing to Tapered Chip Edge Sidewalls)," (Italy) ISPSD' 06: Proceedings of the 18$^{th}$ International Symposium on Power Semiconductor Devices & IC's 2006), June 4-8, 2006, pp. 29-32).

As a method of forming the collector region of the IGBT, a method has been proposed which forms the collector region using SDB (Silicon Direct Bonding) which directly bonds two wafers (for example, see Akio Nakagawa and four others, "1800V Bipolar-Mode MOSFETs: A First Application Wafer Direct Bonding (SDB) Technique to Power Device," (US), IEDM: 1986 International Electron Devices Meeting), 1986, Vol. 32, pp. 122-125).

FIGS. 29 to 31 are cross-sectional views illustrating an IGBT manufacturing process according to the related art. The method of forming the collector region of the IGBT using SDB will be described with reference to FIGS. 29 to 31. First, a first n$^-$ wafer 201 and a second p$^+$ wafer 204 are prepared and the surfaces thereof are mirror-polished. Then, as illustrated in FIG. 29, for example, phosphorous (P) ions are implanted and a thermal activation process is performed to form n$^+$ region 202 with a resistivity lower than that of first wafer 201 on the first main surface of first wafer 201. Then, as illustrated in FIG. 30, for example, boron (B) ions are implanted and a thermal activation process is performed to form p$^+$ region 203 on a surface layer of n$^+$ region 202.

Then, as illustrated in FIG. 31, the main surface of first wafer 201 close to p$^+$ region 203 and the first main surface of second wafer 204 are hydrophilized and directly bonded to each other at room temperature. That is, interface 200 between the bonded wafers is a boundary surface between p$^+$ region 203 and second wafer 204. Then, annealing is performed on a wafer obtained by bonding first wafer 201 and second wafer 204 at a temperature of 1000° C. or more in a nitrogen atmosphere to increase the bonding strength between the wafers. Then, the second main surface of first wafer 201 is ground and thinned to a desired thickness. In this way, a collector region including p$^+$ region 203 and second wafer 204 is formed in the wafer obtained by bonding first wafer 201 and second wafer 204.

As another method, the following method has been proposed. In the method illustrated in FIGS. 29 to 31, p$^+$ region 203 is not formed in the first main surface of first wafer 201 and the surface of n$^+$ region 202 of first wafer 201 and the first main surface of second wafer 204 are bonded to each other. That is, the interface between the bonded wafers is a boundary surface between n$^+$ region 202 and second wafer 204. Then, a method has been proposed in which first wafer 201 is thinned from the second main surface to form a collector region including only second p$^+$ wafer 204 (for example, see U.S. Pat. No. 5,541,122). U.S. Pat. No. 5,541,122 discloses the formation conditions of n$^+$ region 202. The method illustrated in FIGS. 29 to 31 discloses the formation conditions of n$^+$ region 202 and p$^+$ region 203.

As another method, the following method has been proposed. FIG. 32 is a cross-sectional view illustrating a semiconductor device formed by bonding wafers according to the related art. A method has been proposed in which surface structures 212 and 213 of the semiconductor device are formed on the first main surface and the second main surfaces of two wafers 211 and 214 which are thinned from the second main surface are directly bonded to each other to form a semiconductor device. That is, interface 210 between the bonded wafers is a boundary surface between first wafer 211 and second wafer 214 (for example, see U.S. Pat. No. 6,194,290).

As a general method for bonding the wafers, the following methods have been proposed: a method of integrating wafers through H$_2$O absorbed to "Si—OH—" in the surfaces of the wafers; a method of replacing "—F" with high surface density which is attached to the surface of the wafer with "—OH" and bonding the wafer to a wafer having an insulating layer formed therein; and a method of providing an n$^+$ semiconductor layer with a resistivity lower than that of an n$^-$ semiconductor layer between an insulating layer and the n$^-$ semiconductor layer serving as an active layer on an SOI substrate to obtain a gettering effect for metal contamination (for example, see JP 4232645 B1).

The present invention is directed to overcoming or at least reducing the effects of one or more of the problems set forth above.

SUMMARY OF THE INVENTION

The inventors conducted intensive studies and found that the following problems occurred in the isolation region forming method according to the related art. In the reverse blocking IGBT shown in FIG. 26, it is necessary to perform the thermal diffusion process for a long time in order to form isolation region 121 which extends from the first main surface to the second main surface of wafer 101. When isolation region 121 is formed with a diffusion depth of, for example, about 100 μm and a heat treatment is performed at a temperature of 1200° C. or more in an oxygen atmosphere, the diffusion time is about 100 hours.

When the diffusion time increases, an oxygen (O) atom is penetrated between the atoms of a silicon (Si) crystal lattice up to solid solubility at the heat treatment temperature and an oxygen precipitate which becomes a silicon (Si)-oxygen (O) crystal defect is deposited in the wafer. Therefore, when the FZ wafer is used to manufacture the reverse blocking IGBT, the advantages of the FZ wafer in terms of physical properties deteriorate.

In addition, in the subsequent cooling process, when the temperature of the wafer is in the range of 300° C. to 500° C., the crystal defect in the wafer serves as a donor and the impurity concentration of the drift region is changed. This problem is more noticeable as the breakdown voltage of the element increases. The reason is that, as the breakdown voltage increases, the thickness of the drift region increases, which results in an increase in the diffusion time required to form the isolation region. Therefore, the breakdown voltage is reduced or the amount of leakage current increases. As a result, the performance or reliability of the reverse blocking IGBT is reduced and yield is likely to be significantly reduced.

In the reverse blocking IGBT shown in FIG. 26, since the diffusion time required to form the isolation region is long, it is necessary to sufficiently getter a metal contamination generated in the diffusion process. As a method of gettering the metal contamination generated in the diffusion process, for example, the following methods have been known: a method of forming fine scratches in the surface of the wafer using polishing; a method of forming a poly-Si buffered seal (PBS); and a method of forming a high-concentration diffusion layer. However, the performance of the gettering layer needs to be improved as the breakdown voltage increases. In this case, a wafer cost increases in correspondence with the improvement in the performance.

Furthermore, in the reverse blocking IGBT shown in FIG. 27, when the breakdown voltage of the element increases, the depth of the trench serving as an isolation region increases and the aspect ratio increases. Therefore, when ion implantation is performed for the side wall of the trench, it is necessary to implant an extra dopant according to an incident angle during ion implantation (hereinafter, referred to as dose loss) or ion implantation is blocked by a side wall opposite to the side wall of the trench into which ions are implanted. As a result, it is difficult to implant ions at a desired position with high controllability. In addition, after the trench is formed, it is necessary to fill the trench with, for example, a semiconductor film or an insulating film without generating a void in the trench in order to prevent the occurrence of defects in the trench due to the residue of the resist or chemicals used to form the element structure. However, in this case, since the aspect ratio of the trench is high, it is difficult to fill the trench with a semiconductor film or an insulating film.

In the reverse blocking IGBT shown in FIG. 28, in general, a technique for forming a groove in a bulk MEMS (Micro Electro Mechanical Systems) process is used to form concave portion 123 in wafer 101. However, when an electrically active region (p-type region 124) is formed in the side wall of concave portion 123, in the bulk MEMS process, process controllability, such as the shape of a facet joint or the etching rate when the concave portion is formed, deteriorates, as compared to the semiconductor process according to the related art. In the process for forming the concave portion, yield is limited. Therefore, when the reverse blocking IGBT is manufactured by the bulk MEMS process, the controllability of the process for forming the concave portion is reduced. As a result, yield is reduced.

In the reverse blocking IGBT shown in FIG. 28, the angle formed between the side wall of concave portion 123 and the main surface of wafer 101 is about 54.7°. Therefore, in the ion implantation for forming p-type region 124 in the side wall of concave portion 123, the dose loss according to the incident angle during ion implantation is less than that in the ion implantation performed in a direction which is inclined with respect to the plane substantially perpendicular to the main surface of the wafer (for example, see FIG. 27). However, the ion implantation dose is two times more than that when ion implantation is performed in a direction perpendicular to the main surface of the wafer (see JP 2006-303410 A). In addition, the dose of ions required for ion implantation which is performed for the corner of the facet joint is more than that of ions required for the ion implantation performed for the side wall of concave portion 123.

In the reverse blocking IGBT shown in FIG. 28, when activation using laser irradiation is performed after ion implantation for forming p collector region 102 and p-type region 124 is performed, a laser beam is incident on the side wall of concave portion 123 in a direction which is inclined with respect to the main surface of the wafer and the activation rate in the side wall of concave portion 123 is reduced. The dose of ions required to obtain a desired activation rate in the side wall of concave portion 123 is several times more than that when ion implantation is performed in a direction perpendicular to the main surface of the wafer. In this case, the ion implantation is performed for a long time or the impurity concentration of p collector region 102 is higher than necessary. As a result, the electrical characteristics of the reverse blocking IGBT are not balanced.

When the isolation region of the reverse blocking IGBT is formed by SDB as in U.S. Pat. Nos. 5,541,122, 6,194,290, or Akio Nakagawa and four others, "1800V Bipolar-Mode MOSFETs: A First Application Wafer Direct Bonding (SDB) Technique to Power Device," (US), IEDM: 1986 International Electron Devices Meeting), 1986, Vol. 32, pp. 122-125, (see FIGS. 28 and A5), for example, the interface between the bonded wafers is formed in the drift region. In this case, the interface between the bonded wafers traverses a current path. Therefore, the on voltage of the element is increased by a potential barrier due to the trap level at the interface.

The invention has been made in view of the above-mentioned problems and provides a method of manufacturing a semiconductor device which is capable of forming a diffusion region extending from a first main surface to a second main surface of a wafer for a short diffusion time. In addition, the invention provides a method of manufacturing a semiconductor device with a high breakdown voltage. Furthermore, an object of the invention is to provide a method of manufacturing a semiconductor device capable of reducing costs.

In order to solve the above-mentioned problems and achieve the invention, a method of manufacturing a semiconductor device according to a first aspect of the invention has the following characteristics. First, a first region forming step of selectively forming a first semiconductor region of a second conduction type in a surface layer of a first main surface of a first wafer which is a first conduction type is performed. Then, a bonding step of bonding the first main surface of the first wafer and a first main surface of a second wafer which is the first conduction type is performed after the first region forming step. Then, a second region forming step of selectively forming a second semiconductor region of the second conduction type in a surface layer of a second main surface of the second wafer at a position corresponding to the first semiconductor region which is formed in the first main surface of the first wafer is performed. Then, a diffusion step of diffusing the first semiconductor region and the second semiconductor region such that the first semiconductor region and the second semiconductor region are continuous is performed.

According to a second aspect of the invention, in the method of manufacturing a semiconductor device according to the first aspect, in the second region forming step, the second semiconductor region may be formed so as to overlap the first semiconductor region in a depth direction of a wafer obtained by bonding the first wafer and the second wafer.

According to a third aspect of the invention, in the method of manufacturing a semiconductor device according to the first aspect, a thinning step of removing a wafer obtained by bonding the first wafer and the second wafer from the second main surface of the first wafer and thinning the wafer such that the second wafer is exposed may be further performed after the diffusion step.

According to a fourth aspect of the invention, in the method of manufacturing a semiconductor device according to the first aspect, an element structure forming step of forming a surface element structure of an insulated gate bipolar transistor on the second main surface of the second wafer may be further performed between the diffusion step and the thinning step.

According to a fifth aspect of the invention, in the method of manufacturing a semiconductor device according to the fourth aspect, in the element structure forming step, only the surface element structure before a metal wiring layer is formed may be formed. In the thinning step, a protective film may be provided to cover the surface of the surface element structure before the metal wiring layer is formed and then the wafer obtained by bonding the first wafer and the second wafer may be thinned.

According to a sixth aspect of the invention, in the method of manufacturing a semiconductor device according to the fourth aspect, light ion irradiation and a heat treatment may be performed to adjust a lifetime of a minor carrier in the wafer obtained by bonding the first wafer and the second wafer between the element structure forming step and the thinning step.

According to a seventh aspect of the invention, in the method of manufacturing a semiconductor device according to the fourth aspect, light ion irradiation and a heat treatment which is performed at a temperature of 300° C. or more and 400° C. or less for a time of 30 minutes or more and 90 minutes or less may be performed to adjust a lifetime of a minor carrier in the wafer obtained by bonding the first wafer and the second wafer between the element structure forming step and the thinning step.

According to an eighth aspect of the invention, in the method of manufacturing a semiconductor device according to the first aspect, a third region forming step of forming a third semiconductor region of the second conduction type in the first main surface of the second wafer so as to come into contact with the first semiconductor region may be further performed after the thinning step.

According to a ninth aspect of the invention, in the method of manufacturing a semiconductor device according to the fifth aspect, a third region forming step of forming a third semiconductor region of the second conduction type in the first main surface of the second wafer so as to come into contact with the first semiconductor region may be further performed after the thinning step.

According to a tenth aspect of the invention, in the method of manufacturing a semiconductor device according to the eighth aspect, after the third region forming step, light ion irradiation and a heat treatment may be performed to adjust a lifetime of a minor carrier in the wafer obtained by bonding the first wafer and the second wafer.

According to an eleventh aspect of the invention, in the method of manufacturing a semiconductor device according to the eighth aspect, after the third region forming step, light ion irradiation and a heat treatment which is performed at a temperature of 300° C. or more and 400° C. or less for a time of 30 minutes or more and 90 minutes or less may be performed to adjust a lifetime of a minor carrier in the wafer obtained by bonding the first wafer and the second wafer.

According to a twelfth aspect of the invention, in the method of manufacturing a semiconductor device according to the eighth aspect, in the third region forming step, second-conduction-type impurity ions may be implanted into the first main surface of the second wafer and a heat treatment may be performed at a temperature of 1000° C. or less to form the third semiconductor region.

According to a thirteenth aspect of the invention, in the method of manufacturing a semiconductor device according to the ninth aspect, in the third region forming step, second-conduction-type impurity ions may be implanted into the first main surface of the second wafer and a heat treatment may be performed at a temperature of 1000° C. or less to form the third semiconductor region.

According to a fourteenth aspect of the invention, in the method of manufacturing a semiconductor device according to the eighth aspect, in the third region forming step, second-conduction-type impurity ions may be implanted into the first main surface of the second wafer and a laser beam with an irradiation energy density of $1.0 \times 10^{-3}$ J/cm$^2$ or more and $2.0 \times 10^{-3}$ J/cm$^2$ or less and a photon energy greater than 1.1 eV may be irradiated to the first main surface of the second wafer to form the third semiconductor region.

According to a fifteenth aspect of the invention, in the method of manufacturing a semiconductor device according to the first aspect, in the bonding step, the termination of a silicon bond in the first main surface of the first wafer and the first main surface of the second wafer may be replaced with a hydroxyl group and the first main surface of the first wafer and the first main surface of the second wafer may be bonded to each other.

According to a sixteenth aspect of the invention, in the method of manufacturing a semiconductor device according to the first aspect, in the bonding step, the first main surface of the first wafer and the first main surface of the second wafer may be bonded to each other and a heat treatment may be performed at a temperature of 900° C. or more and 1200° C. or less for a time of 30 minutes or more and 120 minutes or less in an inert gas atmosphere to bond the first main surface of the first wafer and the first main surface of the second wafer using a single bond between silicon atoms in the surfaces of the wafers.

According to a seventeenth aspect of the invention, in the method of manufacturing a semiconductor device according to the first aspect, a step of thinning the second wafer from the second main surface may be further performed between the bonding step and the second region forming step.

According to an eighteenth aspect of the invention, in the method of manufacturing a semiconductor device according to the first aspect, a silicon wafer manufactured by a Czochralski method may be used as the first wafer.

According to a nineteenth aspect of the invention, in the method of manufacturing a semiconductor device according to any one of the first to eighteenth aspects, a silicon wafer manufactured by a floating zone method may be used as the second wafer.

In order to solve the above-mentioned problems and achieve the objects of the invention, a method of manufacturing a semiconductor device according to a twentieth aspect has the following characteristics. First, a first region forming step of selectively forming a first semiconductor region of a second conduction type in a surface layer of a first main surface of a first wafer which is a first conduction type is performed. Then, an epitaxial step of growing an epitaxial layer of the first conduction type on the first main surface of the first wafer is performed after the first region forming step. Then, a bonding step for bonding a surface of the first wafer close to the epitaxial layer and a first main surface of a second wafer which is the first conduction type is performed. Then, a second region forming step of selectively forming a second semiconductor region of the second conduction type in a surface layer of a second main surface of the first wafer at a position corresponding to the first semiconductor region which is formed in the first main surface of the first wafer. Then, a diffusion step of diffusing the first semiconductor region and the second semiconductor region such that the first semiconductor region reaches the second wafer and the first semiconductor region and the second semiconductor region are continuous is performed.

According to a twenty-first aspect of the invention, in the method of manufacturing a semiconductor device according to the twentieth aspect, in the second region forming step, the second semiconductor region may be formed so as to overlap the first semiconductor region in a depth direction of a wafer obtained by bonding the first wafer and the second wafer.

According to a twenty-second aspect of the invention, in the method of manufacturing a semiconductor device according to the twentieth aspect, a thinning step of removing a wafer obtained by bonding the first wafer and the second wafer from the second main surface of the second wafer and thinning the wafer such that the epitaxial wafer is exposed may be further performed after the diffusion step.

According to a twenty-third aspect of the invention, in the method of manufacturing a semiconductor device according to the twentieth aspect, an element structure forming step of forming a surface element structure of an insulated gate bipolar transistor on the second main surface of the second wafer may be further performed between the diffusion step and the thinning step.

According to a twenty-fourth aspect of the invention, in the method of manufacturing a semiconductor device according to the twenty-second aspect, in the element structure forming step, only the surface element structure before a metal wiring layer is formed may be formed. In the thinning step, a protective film may be provided so as to cover the surface of the surface element structure before the metal wiring layer is formed and the wafer obtained by bonding the first wafer and the second wafer may be thinned.

According to a twenty-fifth aspect of the invention, in the method of manufacturing a semiconductor device according to the twenty-second aspect, light ion irradiation and a heat treatment may be performed to adjust a lifetime of a minor carrier in the wafer obtained by bonding the first wafer and the second wafer between the element structure forming step and the thinning step.

According to a twenty-sixth aspect of the invention, in the method of manufacturing a semiconductor device according to the twenty-second aspect, light ion irradiation and a heat treatment which is performed at a temperature of 300° C. or more and 400° C. or less for a time of 30 minutes or more and 90 minutes or less may be performed to adjust a lifetime of a minor carrier in the wafer obtained by bonding the first wafer and the second wafer between the element structure forming step and the thinning step.

According to a twenty-seventh aspect of the invention, the method of manufacturing a semiconductor device according to the twentieth aspect may further include a third region forming step of forming a third semiconductor region of the second conduction type in the first main surface of the second wafer so as to come into contact with the first semiconductor region after the thinning step.

According to a twenty-eighth aspect of the invention, the method of manufacturing a semiconductor device according to the twenty-fourth aspect may further include a third region forming step of forming a third semiconductor region of the second conduction type in the first main surface of the second wafer so as to come into contact with the first semiconductor region after the thinning step.

According to a twenty-ninth aspect of the invention, in the method of manufacturing a semiconductor device according to the twenty-seventh aspect, after the third region forming step, light ion irradiation and a heat treatment may be performed to adjust a lifetime of a minor carrier in the wafer obtained by bonding the first wafer and the second wafer.

According to a thirtieth aspect of the invention, in the method of manufacturing a semiconductor device according to the twenty-seventh aspect, after the third region forming step, light ion irradiation and a heat treatment which is performed at a temperature of 300° C. or more and 400° C. or less for a time of 30 minutes or more and 90 minutes or less may be performed to adjust a lifetime of a minor carrier in the wafer obtained by bonding the first wafer and the second wafer.

According to a thirty-first aspect of the invention, in the method of manufacturing a semiconductor device according to the twenty-seventh aspect, in the third region forming step, second-conduction-type impurity ions may be implanted into the first main surface of the second wafer and a heat treatment may be performed at a temperature of 1000° C. or less to form the third semiconductor region.

According to a thirty-second aspect of the invention, in the method of manufacturing a semiconductor device according to the twenty-eighth aspect, in the third region forming step, second-conduction-type impurity ions may be implanted into the first main surface of the second wafer and a heat treatment may be performed at a temperature of 1000° C. or less to form the third semiconductor region.

According to a thirty-third aspect of the invention, in the method of manufacturing a semiconductor device according to the twenty-seventh aspect, in the third region forming step, second-conduction-type impurity ions may be implanted into the first main surface of the second wafer and a laser beam with an irradiation energy density of $1.0 \times 10^{-3}$ J/cm$^2$ or more and $2.0 \times 10^{-3}$ J/cm$^2$ or less and a photon energy greater than 1.1 eV may be irradiated to the first main surface of the second wafer to form the third semiconductor region.

According to a thirty-fourth aspect of the invention, in the method of manufacturing a semiconductor device according to the twentieth aspect, in the bonding step, the termination of a silicon bond in the surface of the epitaxial layer and the first main surface of the second wafer may be replaced with a hydroxyl group, and the surface of the epitaxial layer and the first main surface of the second wafer may be bonded to each other.

According to a thirty-fifth aspect of the invention, in the method of manufacturing a semiconductor device according to the twentieth aspect, in the bonding step, the surface of the epitaxial layer and the first main surface of the second wafer are bonded to each other and a heat treatment may be performed at a temperature of 900° C. or more and 1200° C. or less for a time of 30 minutes or more and 120 minutes or less in an inert gas atmosphere to bond the surface of the epitaxial layer and the first main surface of the second wafer using a single bond between silicon atoms in the surfaces of the wafers.

According to a thirty-sixth aspect of the invention, in the method of manufacturing a semiconductor device according to the twentieth aspect, the first wafer may be thinned from the second main surface between the bonding step and the second region forming step.

According to a thirty-seventh aspect of the invention, in the method of manufacturing a semiconductor device according to the twenty-second aspect, in the thinning step, the wafer obtained by bonding the first wafer and the second wafer may be thinned until the thickness of the epitaxial layer is one-third of the thickness of a drift region of a completed element.

According to a thirty-eighth aspect of the invention, in the method of manufacturing a semiconductor device according to the twentieth aspect, a silicon wafer manufactured by a floating zone method may be used as the first wafer.

According to a thirty-ninth aspect of the invention, in the method of manufacturing a semiconductor device according to any one of the twentieth to thirty-eighth aspect, a silicon wafer manufactured by a Czochralski method may be used as the second wafer.

According to the invention, the first semiconductor region of the second conduction type and the second semiconductor region of the second conduction type which are formed so as to be separated from each other are diffused in a wafer (hereinafter, referred to as a composite wafer) obtained by bonding the first wafer and the second wafer to form a second-conduction-type diffusion region (through silicon isolation region) which continuously extends from the first main surface to the second main surface of the drift region of the completed element. Therefore, each of the first semiconductor region and the second semiconductor region may be diffused only to about half the thickness of the drift region of the completed element. In this way, it is possible to reduce the diffusion time required to form the through silicon isolation region, as compared to the related art.

Since the diffusion time required to form the through silicon isolation region can be reduced, it is possible to prevent, for example, a reduction in breakdown voltage or an increase in leakage current in the reverse breakdown voltage IGBT due to an oxygen precipitate or an oxygen donor caused by the long diffusion time of through silicon isolation region 20 even when the drift region of the element is thick. In this way, it is possible to increase the breakdown voltage of the element.

When a CZ wafer and an FZ wafer are used as the first and second wafers and the two wafers are directly bonded to each other, in the process of thermally diffusing the through silicon isolation region, it is possible to getter metal ions in which an oxygen intrinsic gettering (IG) center is contaminated in the CZ wafer. Therefore, it is possible to improve the gettering capability of the reverse blocking IGBT manufacturing process. In this way, it is not necessary to form a special gettering layer in the FZ wafer, unlike the related art.

In the twentieth to thirty-ninth aspects of the invention, since the epitaxial layer is provided between the first wafer and the second wafer, it is possible to further reduce the diffusion time of the first semiconductor region and the second semiconductor region. Therefore, it is possible to further reduce the diffusion time required to form the through silicon isolation region.

According to the method of manufacturing a semiconductor device of the invention, it is possible to form the diffusion region which extends from the first main surface to the second main surface of the wafer for a short diffusion time. In addition, it is possible to provide a method of manufacturing a semiconductor device with a high breakdown voltage. It is possible to reduce costs.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
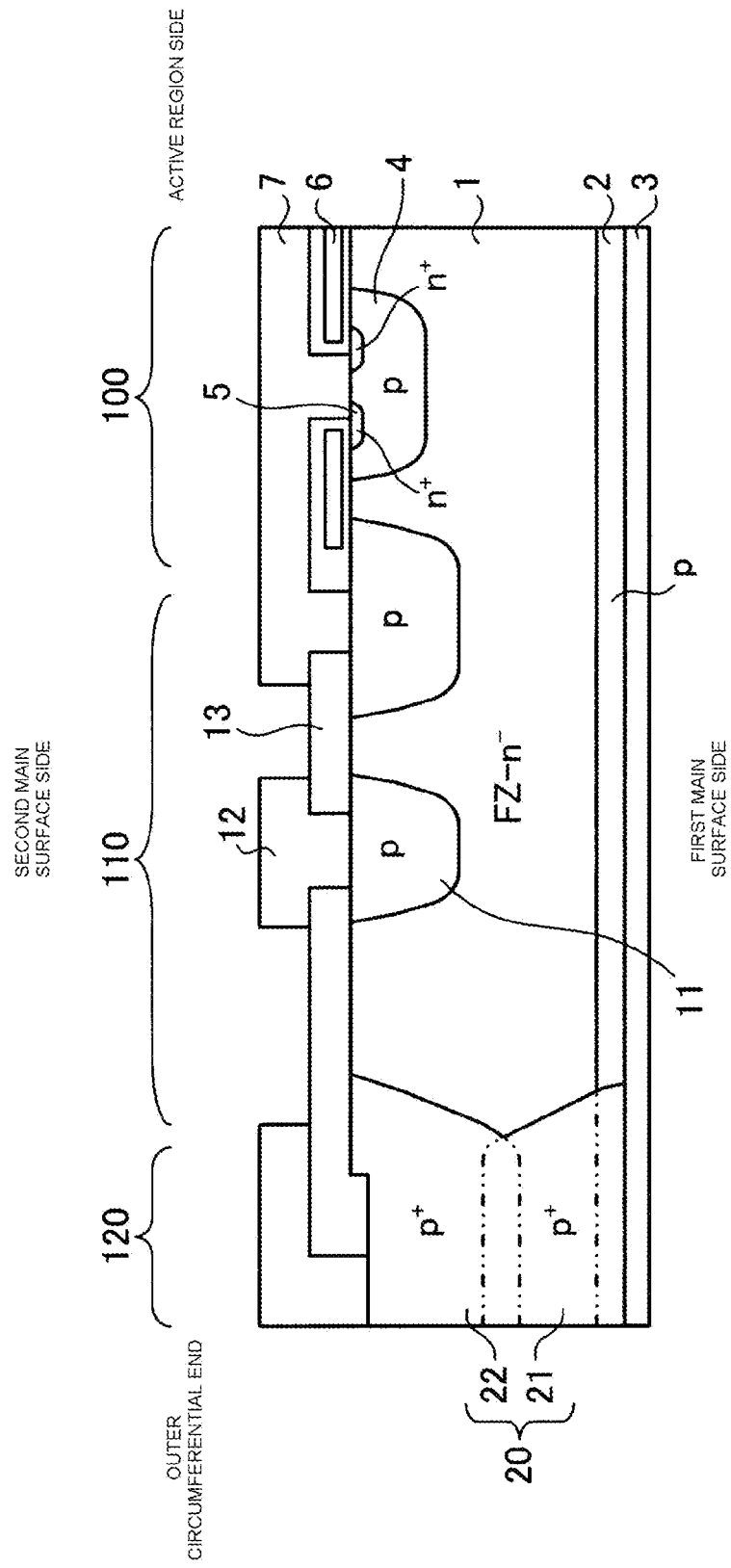
FIG. 1 is a cross-sectional view illustrating a reverse blocking IGBT according to a first embodiment.

Hereinafter, methods of manufacturing semiconductor devices according to exemplary embodiments of the invention will be described in detail with reference to the accompanying drawings. In the specification and the accompanying drawings, in the layers or regions having "n" or "p" appended thereto, an electron or a hole means a major carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated.

First Embodiment

FIG. 1 is a cross-sectional view illustrating a reverse blocking IGBT according to a first embodiment. The reverse blocking IGBT shown in FIG. 1 includes an n⁻ (first conduction type) wafer (second wafer) 1 which becomes a drift region, active region 100, and breakdown voltage structure 110 which surrounds active region 100. It is preferable that, for example, a silicon wafer (hereinafter, referred to as an FZ wafer) manufactured by a floating zone (FZ) method be used as wafer 1. P collector region 2 which is a p type (second conduction type) is provided on the entire first main surface of wafer 1. A collector electrode 3 comes into contact with p collector region 2.

In active region 100, for example, a surface element structure of a planar-gate-type IGBT including p base region 4, n⁺ emitter region 5, gate electrode 6, and emitter electrode 7 is formed on the second main surface of wafer 1. Breakdown voltage structure 110 includes a plurality of field limiting rings 11, which are p-type floating regions, and a plurality of conductive films 12 which come into contact with field limiting rings 11. In the second main surface of wafer 1, the surface of a region interposed between adjacent field limiting rings 11 is covered with interlayer insulating film 13.

P-type isolation region (through silicon isolation region) 20 is provided at outer circumferential end 120 of wafer 1 such that it extends from the second main surface of wafer 1 to a drift region and comes into contact with p collector region 2. The through silicon isolation region 20 includes first isolation region (first semiconductor region) 21 which is a p type and second isolation region (second semiconductor region) 22 which is a p type.

First isolation region 21 is provided in a surface layer of the first main surface of wafer 1. In addition, first isolation region 21 comes into contact with p collector region 2 on the side of the first main surface of wafer 1 and comes into contact with second isolation region 22 on the side of the second main surface of wafer 1. Second isolation region 22 is provided in a surface layer of the second main surface of wafer 1. That is, first isolation region 21 and second isolation region 22 form a continuous p-type region (through silicon isolation region 20). It is preferable that the ends of first isolation region 21 and second isolation region 22 overlap each other. Through silicon isolation region 20 surrounds breakdown voltage structure 110. Breakdown voltage structure 110 and outer circumferential end 120 (termination structure) surround active region 100.

Figure 2:
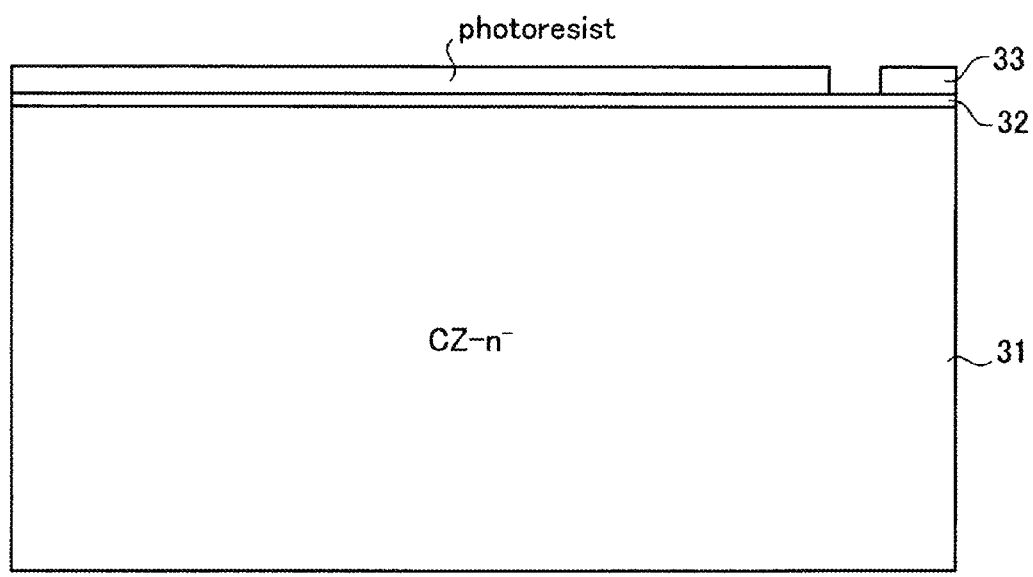
FIG. 2 is a cross-sectional view illustrating a process of manufacturing the reverse blocking IGBT according to the first embodiment.

FIGS. 2 to 13 are cross-sectional views illustrating a process of manufacturing the reverse blocking IGBT according to the first embodiment. First, as shown in FIG. 2, n-type wafer (first wafer) 31 having the first and second main surfaces which are mirror-polished is prepared. For example, it is preferable that a silicon wafer (hereinafter, referred to as a CZ wafer) manufactured by a Czochralski (CZ) method be used as wafer 31. In the first embodiment, CZ wafer 31 is used as a first wafer.

Then, thermally-oxidized film 32 is grown on the first main surface of CZ wafer 31. Then, resist mask 33 having an opening for forming an alignment mark is formed on the surface of thermally-oxidized film 32 by photolithography. The alignment mark is a reference mark, for example, when each region is formed in the wafer or when the wafer is diced. Then, etching is performed using resist mask 33 to remove a portion of thermally-oxidized film 32 which is exposed from the opening of resist mask 33. Then, resist mask 33 is removed. As the etching method, wet etching or dry etching may be used (this holds for the following process of etching the thermally-oxidized film).

Figure 3:
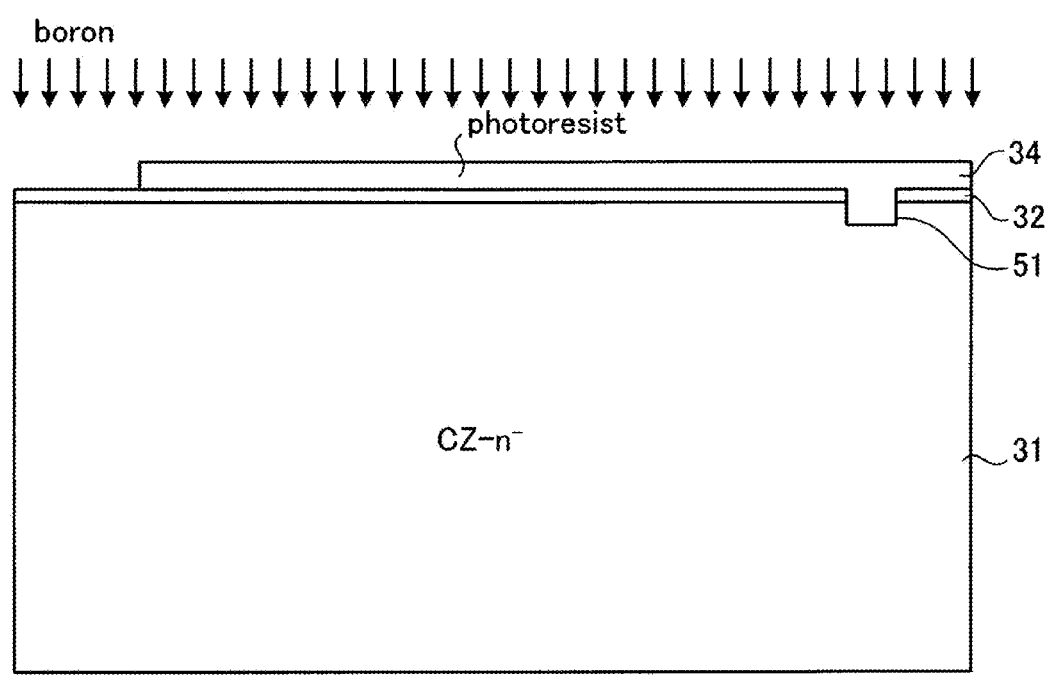
FIG. 3 is a cross-sectional view illustrating the process of manufacturing the reverse blocking IGBT according to the first embodiment.

Then, etching is performed using thermally-oxidized film 32 as a mask to remove a portion of CZ wafer 31 which is exposed from the opening of thermally-oxidized film 32. In this way, as shown in FIG. 3, alignment mark 51 is formed in the surface layer of the first main surface of CZ wafer 31. In this embodiment, as the etching method, chemical dry etching (CDE) may be used (this holds for the following wafer etching process).

Then, resist mask 34 having an opening for forming a first isolation region (see FIG. 1: the first semiconductor region) is formed on the surface of thermally-oxidized film 32 by photolithography. Then, for example, boron ions are implanted into the first main surface of CZ wafer 31 using resist mask 34. In this case, the boron ion implantation dose and acceleration energy may be, for example, $5 \times 10^{15}$ cm$^{-2}$ and 45 keV.

Figure 4:
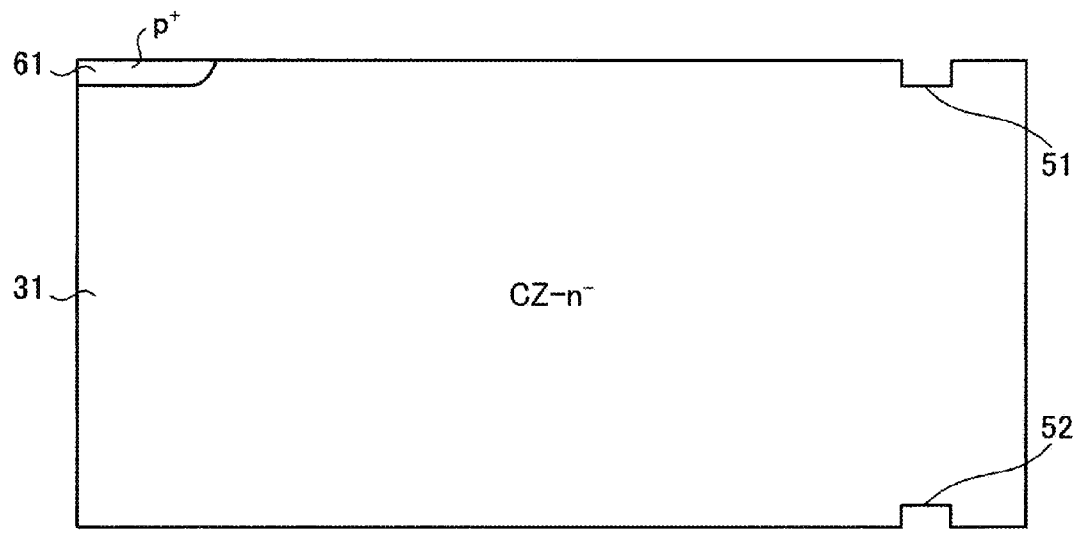
FIG. 4 is a cross-sectional view illustrating the process of manufacturing the reverse blocking IGBT according to the first embodiment.

In this way, first p⁺ impurity region 61, which will be the first isolation region, is formed in a portion of the surface layer of the first main surface of CZ wafer 31 which is exposed from the opening of resist mask 34 (see FIG. 4). First impurity region 61 is formed at the position of alignment mark 51. In FIG. 4, in order to clarify a process of forming the impurity region and the alignment mark, the impurity region is separated from the alignment mark (this holds for FIGS. 5 to 13 and FIGS. 15 to 25).

Then, as shown in FIG. 4, resist mask 34 is removed and CZ wafer 31 is cleaned. Then, alignment mark 52 is formed in the second main surface of CZ wafer 31 at a position corresponding to the position of alignment mark 51 by the same method as that for forming alignment mark 51. That is, alignment mark 52 and alignment mark 51 formed in the first main surface of CZ wafer 31 are symmetric, with CZ wafer 31 interposed therebetween. Then, the thermally-oxidized film (not shown) which is formed as a mask for forming alignment marks 51 and 52 is removed.

Figure 5:
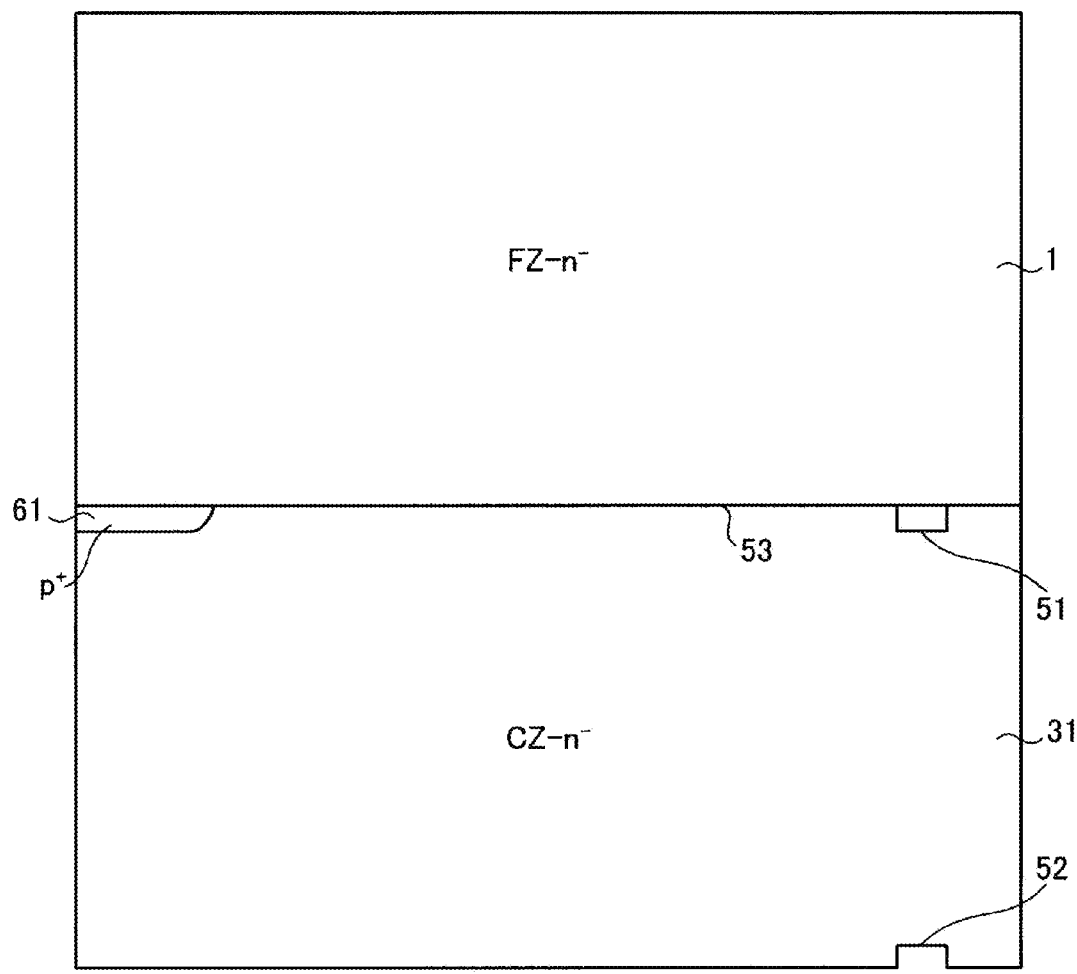
FIG. 5 is a cross-sectional view illustrating the process of manufacturing the reverse blocking IGBT according to the first embodiment.

Then, as shown in FIG. 5, n-type wafer (second wafer) 1 having the first and second main surfaces which are mirror-polished is prepared. Wafer 1 becomes an n⁻ drift region in the completed reverse blocking IGBT (see FIG. 1). It is preferable that, for example, a silicon wafer (hereinafter, referred to as an FZ wafer) manufactured by the floating zone (FZ) method be used as wafer 1. In the first embodiment, FZ wafer 1 is referred to as a second wafer.

Then, for example, CZ wafer 31 and FZ wafer 1 are cleaned using hydrofluoric acid (HF) and native oxide films formed on the surfaces of CZ wafer 31 and FZ wafer 1 are removed. In this way, the surfaces of CZ wafer 31 and FZ wafer 1 are hydrophobized. That is, the termination of a silicon bond in the surfaces of CZ wafer 31 and FZ wafer 1 is replaced with, for example, a fluorine atom (—F) and the hydrophobic property of the surface of the wafer is improved.

Then, CZ wafer 31 and FZ wafer 1 are immersed in pure water ($H_2O$) and the surfaces of CZ wafer 31 and FZ wafer 1 are hydrophilized. That is, the fluorine atom at the termination of the silicon bond in the surfaces of CZ wafer 31 and FZ wafer 1 is replaced with a hydroxyl group (—OH). Then, the first main surface of CZ wafer 31 and the first main surface of FZ wafer 1 are bonded to each other. In this case, the first main surface of CZ wafer 31 and the first main surface of FZ wafer 1 are covered with a hydrophilized hydroxyl group. Therefore, at interface 53 between CZ wafer 31 and FZ wafer 1, the attractive force between CZ wafer 31 and FZ wafer 1 is stronger than that when the wafers with the hydrophobized surfaces are bonded to each other. In this way, the first main surface of CZ wafer 31 and the first main surface of FZ wafer 1 are closely bonded to each other.

Then, a heat treatment is performed such that the first main surface of CZ wafer 31 and the first main surface of FZ wafer 1 are bonded to each other by a single bond between silicon atoms on the surfaces of the wafers. For example, it is preferable that the heat treatment be performed in an inert gas atmosphere, such as a nitrogen ($N_2$) atmosphere, at a temperature of 900° C. or more and 1200° C. or less for a time of 30 minutes or more and 120 minutes or less. In this way, the first main surface of CZ wafer 31 and the first main surface of FZ wafer 1 are bonded to each other by an inter-molecular bond stronger than the attractive force generated by the hydroxyl group covering each main surface.

Then, a wafer (hereinafter, referred to as a composite wafer) obtained by bonding CZ wafer 31 and FZ wafer 1 is cleaned and the oxide films formed on both surfaces of the composite wafer are removed by oxygen ($O_2$) mixed in a heat treatment furnace. The subsequent processes are for the composite wafer even though they are not particularly described.

Figure 6:
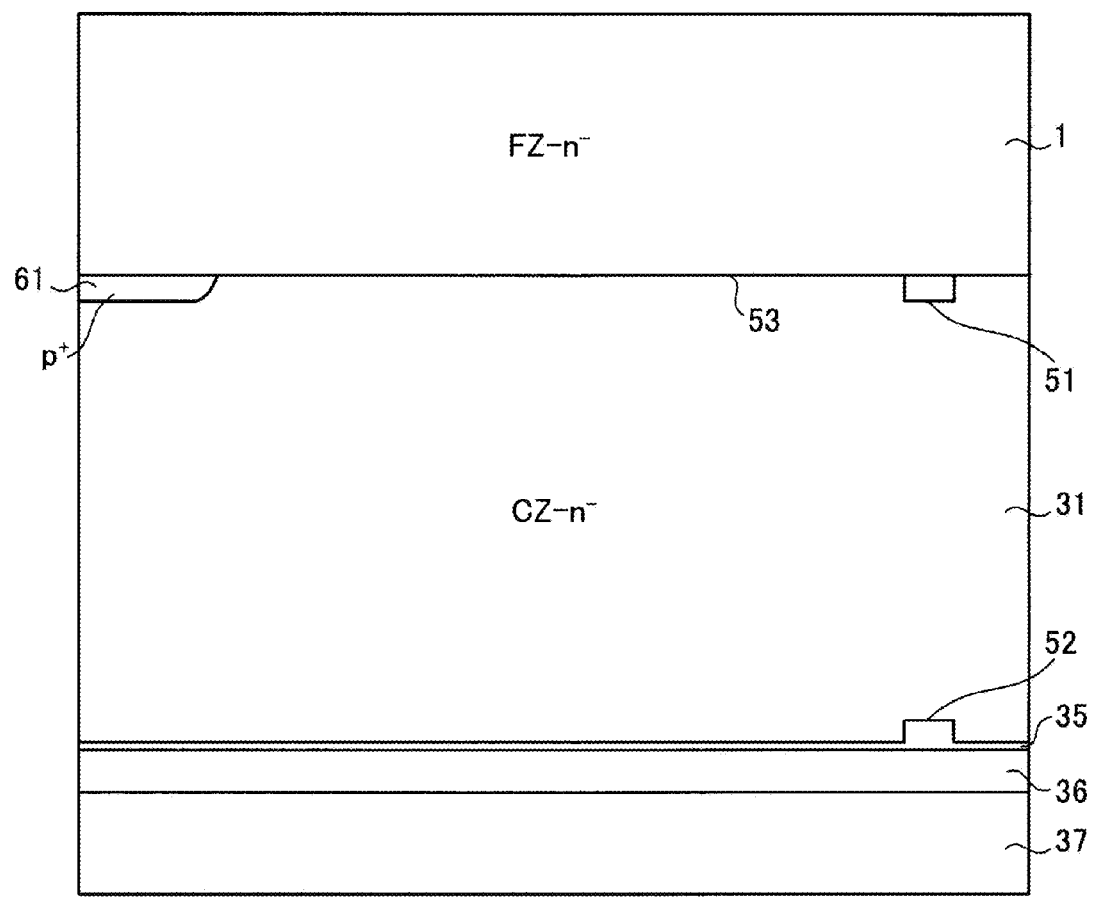
FIG. 6 is a cross-sectional view illustrating the process of manufacturing the reverse blocking IGBT according to the first embodiment.

Then, as shown in FIG. 6, a screen oxide film 35 and a resist film 36 are sequentially formed on the second main surface of CZ wafer 31. Then, for example, light ions, such as electron beams (EB) or protons, are irradiated and a heat treatment is performed at a temperature of 300° C. to 400° C. to control a lifetime such that the properties of resist film 36 are modified and resist film 36 is hardened. Then, tape (hereinafter, referred to as a BG tape) 37 which protects the wafer during back grinding (BG) is attached to the surface of resist film 36.

Then, FZ wafer 1 is ground from the second main surface of FZ wafer 1 and only FZ wafer 1 of the composite wafer is thinned. Then, the second main surface of FZ wafer 1 is mirror-polished. Then, BG tape 37 on the second main surface of CZ wafer 31 peels off and the composite wafer is cleaned. Then, the surface layer of the second main surface of FZ wafer 1 is removed by etching to have a thickness of, for example, 5 µm or more and 20 µm or less. In this way, it is possible to remove scratches or damage of the surface layer of the second main surface of FZ wafer 1 due to, for example, grinding. Then, resist film 36 on the second main surface of CZ wafer 31 is removed and the composite wafer is cleaned.

Figure 7:
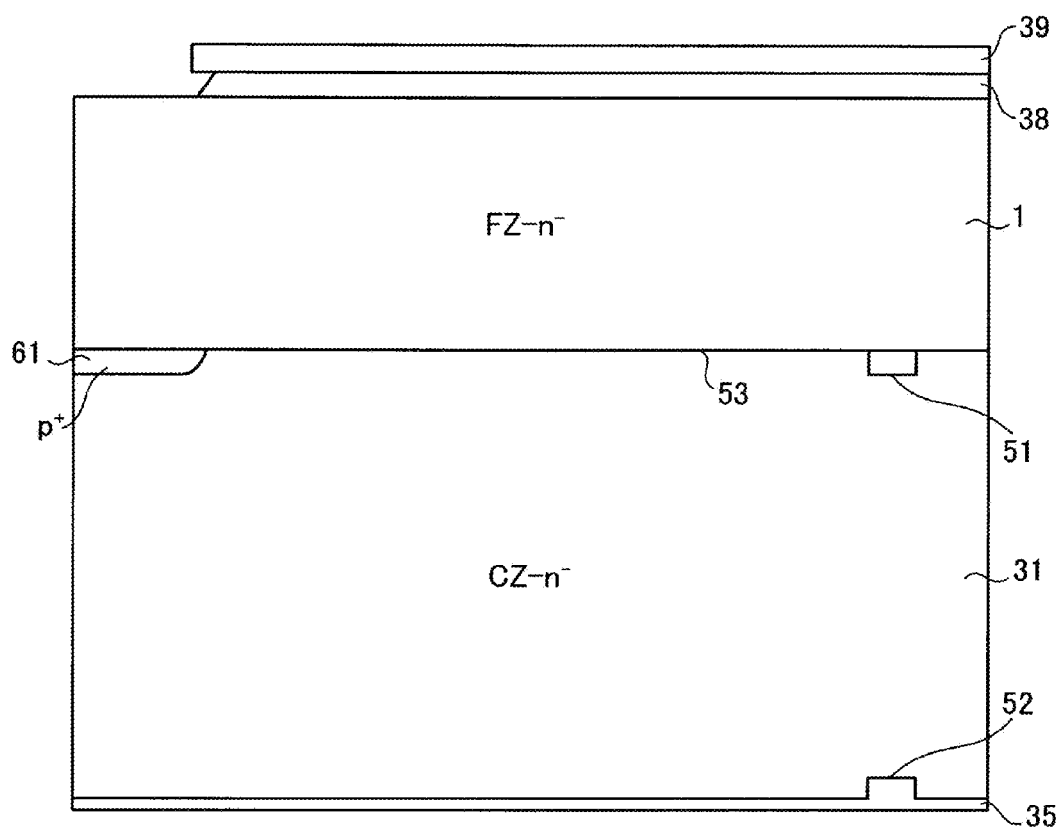
FIG. 7 is a cross-sectional view illustrating the process of manufacturing the reverse blocking IGBT according to the first embodiment.

Then, as shown in FIG. 7, thermally-oxidized film 38 is grown on the second main surface of FZ wafer 1. The thickness of thermally-oxidized film 38 may be, for example, 0.8 µm. Then, resist mask 39 having an opening for forming an alignment mark is formed on the surface of thermally-oxidized film 38 by photolithography. Then, etching is performed using resist mask 39 to remove a portion of thermally-oxidized film 38 which is exposed from the opening of resist mask 39. In this embodiment, for example, wet etching may be used. Then, resist mask 39 is removed.

Figure 8:
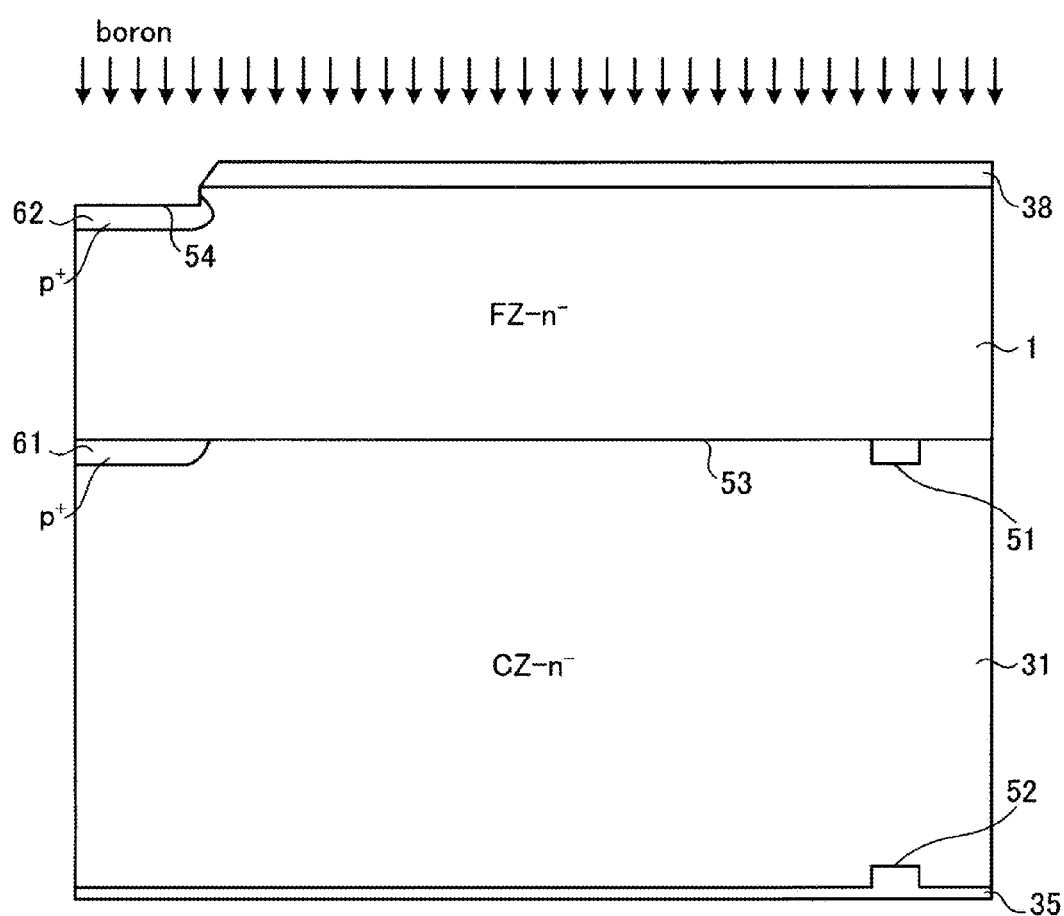
FIG. 8 is a cross-sectional view illustrating the process of manufacturing the reverse blocking IGBT according to the first embodiment.

Then, as shown in FIG. 8, an alignment mark 54 is formed in a portion of the surface layer of FZ wafer 1 which is exposed from the opening of thermally-oxidized film 38 so as to correspond to alignment mark 52. That is, alignment mark 54 and alignment mark 52 formed in the second main surface of CZ wafer 31 are symmetric, with CZ wafer 31 and FZ wafer 1 interposed therebetween. In this embodiment, for example, chemical dry etching is performed to transfer the position of alignment mark 52 to the surface layer of FZ wafer 1. Then, the composite wafer is cleaned.

Then, a screen oxide film (not shown) is grown on the second main surface of FZ wafer 1 and the second main surface of CZ wafer 31. Then, a resist mask (not shown) having an opening for forming second isolation region (see FIG. 1: the second semiconductor region) is formed. Then, for example, boron ions are implanted into the second main surface of FZ wafer 1 using the resist mask. In this way, second $p^+$ impurity region 62, which will be the second isolation region, is formed in a portion of the surface layer of the second main surface of FZ wafer 1 which is exposed from the opening of the resist mask.

Second impurity region 62 is formed in the surface layer of the second main surface of FZ wafer 1 at a position corresponding to first impurity region 61 formed in the first main surface of CZ wafer 31. Therefore, for example, first impurity region 61 and second impurity region 62 are formed so as to overlap each other at the end (outer circumferential end) of the chip after dicing in the depth direction of the composite wafer. That is, first impurity region 61 and second impurity region 62 are formed so as to overlap each other in the vicinity of a dicing line in the depth direction of the composite wafer. The ion implantation dose and acceleration energy for forming second impurity region 62 may be equal to those in ion implantation for forming first impurity region 61.

Then, etching is performed to reduce the thickness of the oxide film including the screen oxide film (not shown) and thermally-oxidized film 38 on the second main surface of FZ wafer 1 except for the screen oxide film (not shown) formed on second impurity region 62 to about 0.15 µm. For example, wet etching may be used.

Figure 9:
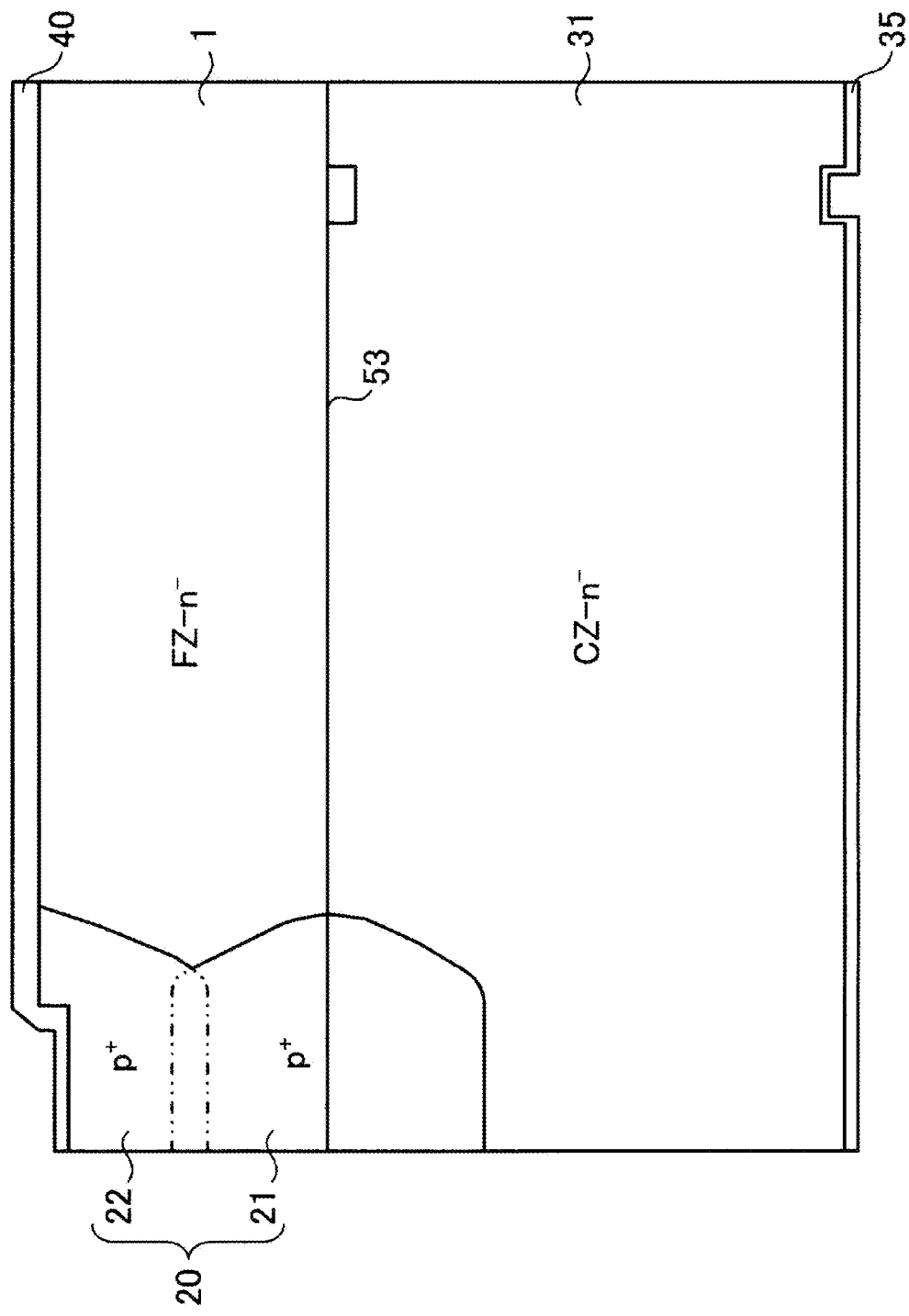
FIG. 9 is a cross-sectional view illustrating the process of manufacturing the reverse blocking IGBT according to the first embodiment.

Then, as shown in FIG. 9, a heat treatment is performed for the composite wafer to diffuse first impurity region 61 and second impurity region 62 such that first impurity region 61 and second impurity region 62 are continuous. In the heat treatment, first impurity region 61 is diffused to CZ wafer 31 of the composite wafer and becomes first isolation region 21. In addition, second impurity region 62 is diffused to CZ wafer 31 and FZ wafer 1 of the composite wafer and becomes second isolation region 22. That is, through silicon isolation region 20 including first isolation region 21 and second isolation region 22 is formed by the heat treatment.

In this case, it is preferable to diffuse first impurity region 61 and second impurity region 62 such that first isolation region 21 and second isolation region 22 overlap each other. For example, it is preferable that the heat treatment be performed at a temperature of 1250° C. or more and 1300° C. or less in an oxygen atmosphere in which a certain amount of oxygen is continuously introduced into the heat treatment furnace. In the heat treatment for forming through silicon isolation region 20, since the thickness of oxide film 40 including the screen oxide film (not shown) and thermally-oxidized film 38 on the second main surface of FZ wafer 1 is reduced to the above-mentioned value in the previous process, the heat treatment which is performed at a high temperature for a long time makes it possible to prevent the second main surface of FZ wafer 1 from being roughened.

Figure 10:
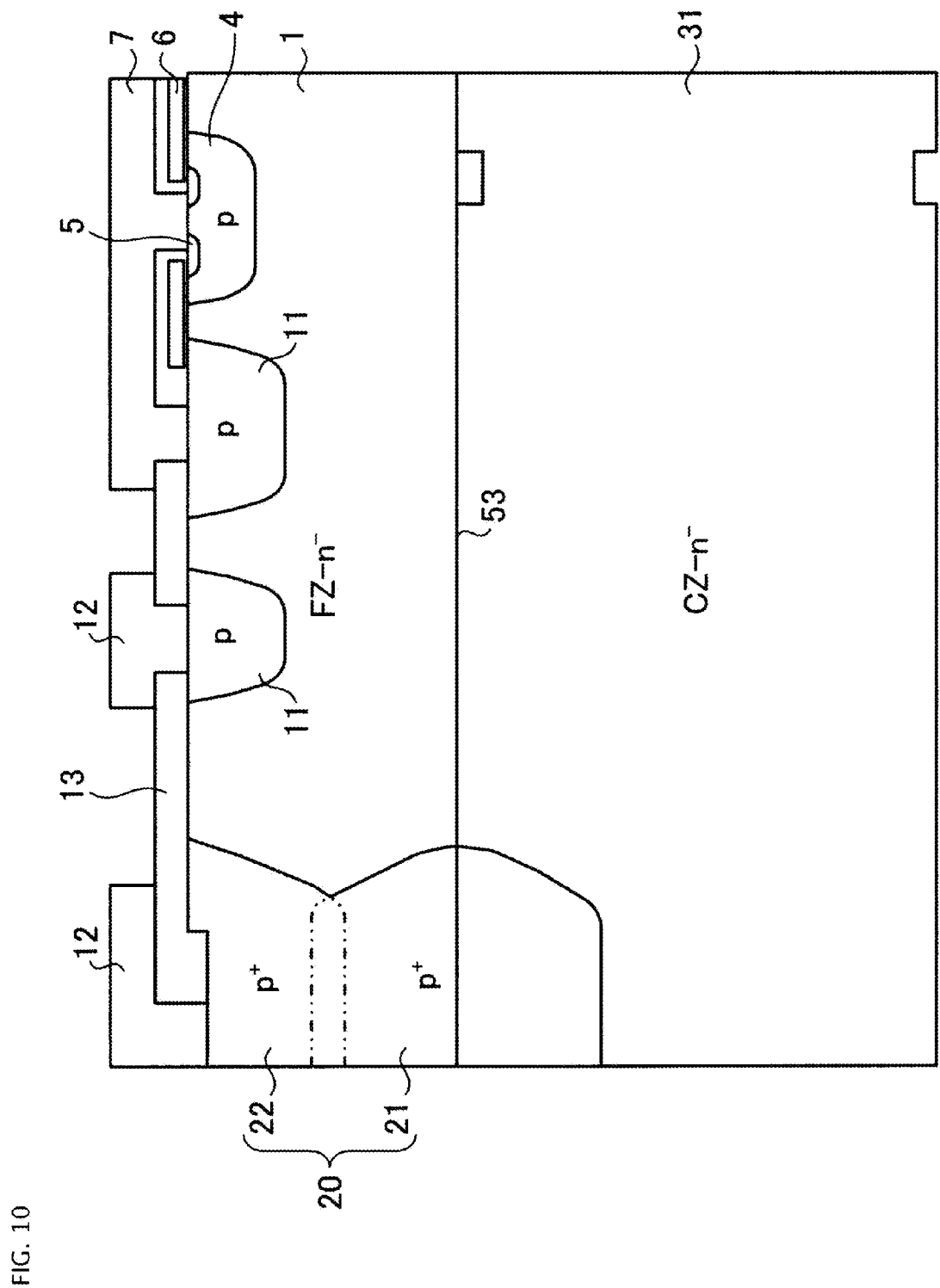
FIG. 10 is a cross-sectional view illustrating the process of manufacturing the reverse blocking IGBT according to the first embodiment.

Then, as shown in FIG. 10, screen oxide film 35 on the second main surface of CZ wafer 31, and thermally-oxidized film 38 and the screen oxide on the second main surface of film FZ wafer 1 are removed. Then, for example, the surface element structure of the reverse blocking IGBT is formed on the second main surface of FZ wafer 1 by a general method for forming the surface element structure. Specifically, in active region 100, the surface element structure of the planar gate-type IGBT including, for example, p base region 4, $n^+$ emitter region 5, gate electrode 6, and emitter electrode 7 is formed. For example, the surface element structure before the metal wiring layer is formed may be formed and then other processes may be performed. Then, the process of forming the surface element structure may be continuously performed. In breakdown voltage structure 110, a plurality of field limiting rings 11 and a plurality of conductive films 12 are formed.

Figure 11:
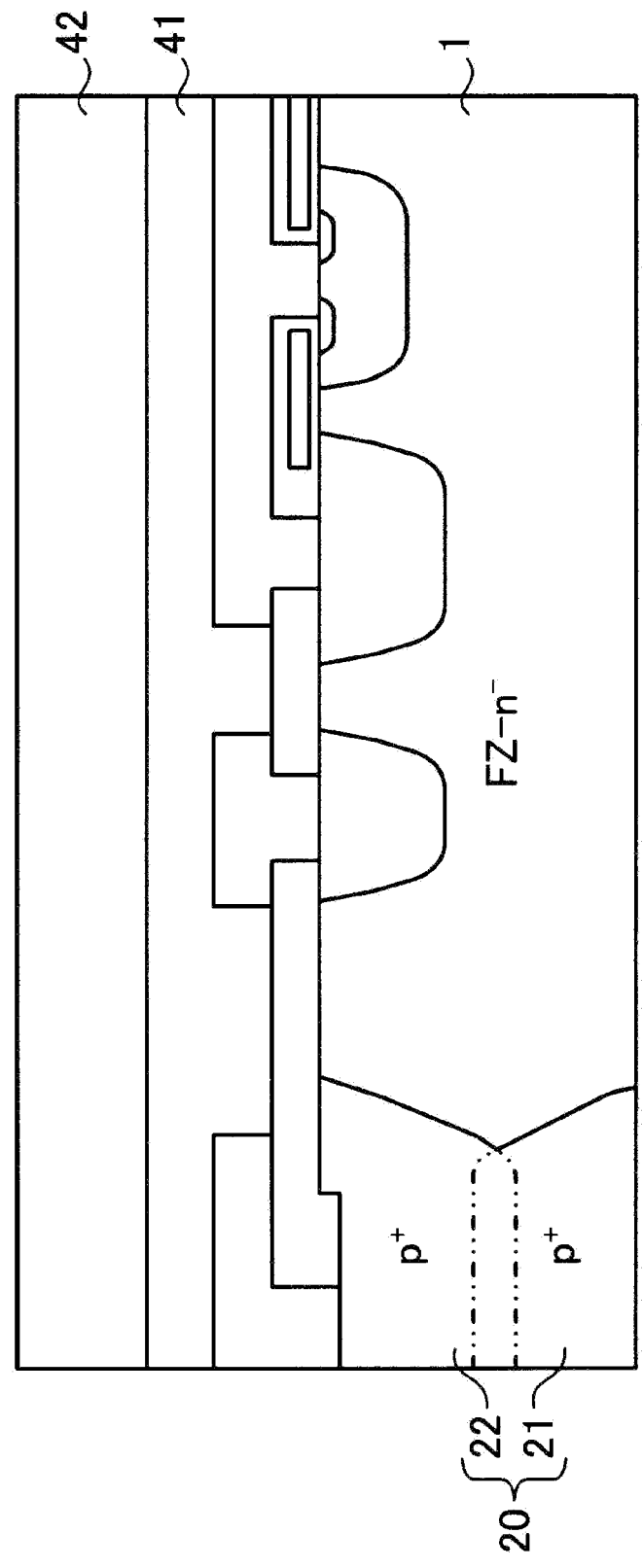
FIG. 11 is a cross-sectional view illustrating the process of manufacturing the reverse blocking IGBT according to the first embodiment.

Then, as shown in FIG. 11, resist film (protective film) 41 is coated on the second main surface of FZ wafer 1 to cover the surface element structure on the second main surface of FZ wafer 1. Then, for example, light ions, such as electron beams or protons, are irradiated and the heat treatment is performed at a temperature of 300° C. to 400° C. to control the lifetime such that resist film 41 is modified and hardened. Then, BG tape 42 is attached to the surface of resist film 41.

Then, the composite wafer is ground from the second main surface of CZ wafer 31 and is thinned. In this case, the composite wafer is ground until FZ wafer 1 is exposed from a surface (hereinafter, referred to as the first main surface of FZ wafer 1) opposite to the surface of the composite wafer on which the surface element structure is formed. That is, the composite wafer is ground until interface 53 between CZ wafer 31 and FZ wafer 1 is completely removed. In this way, CZ wafer 31 is completely removed. In addition, through silicon isolation region 20 extends from the second main surface to the first main surface of FZ wafer 1.

Then, BG tape 42 on the second main surface of FZ wafer 1 peels off and the composite wafer is cleaned. Then, the surface layer of the first main surface of FZ wafer 1 is removed by etching such that the thickness thereof is equal to or greater than 5 µm and equal to or less than 20 µm. In this way, it is possible to remove, for example, scratches or damage of the surface layer of the first main surface of FZ wafer 1 due to grinding.

Figure 12:
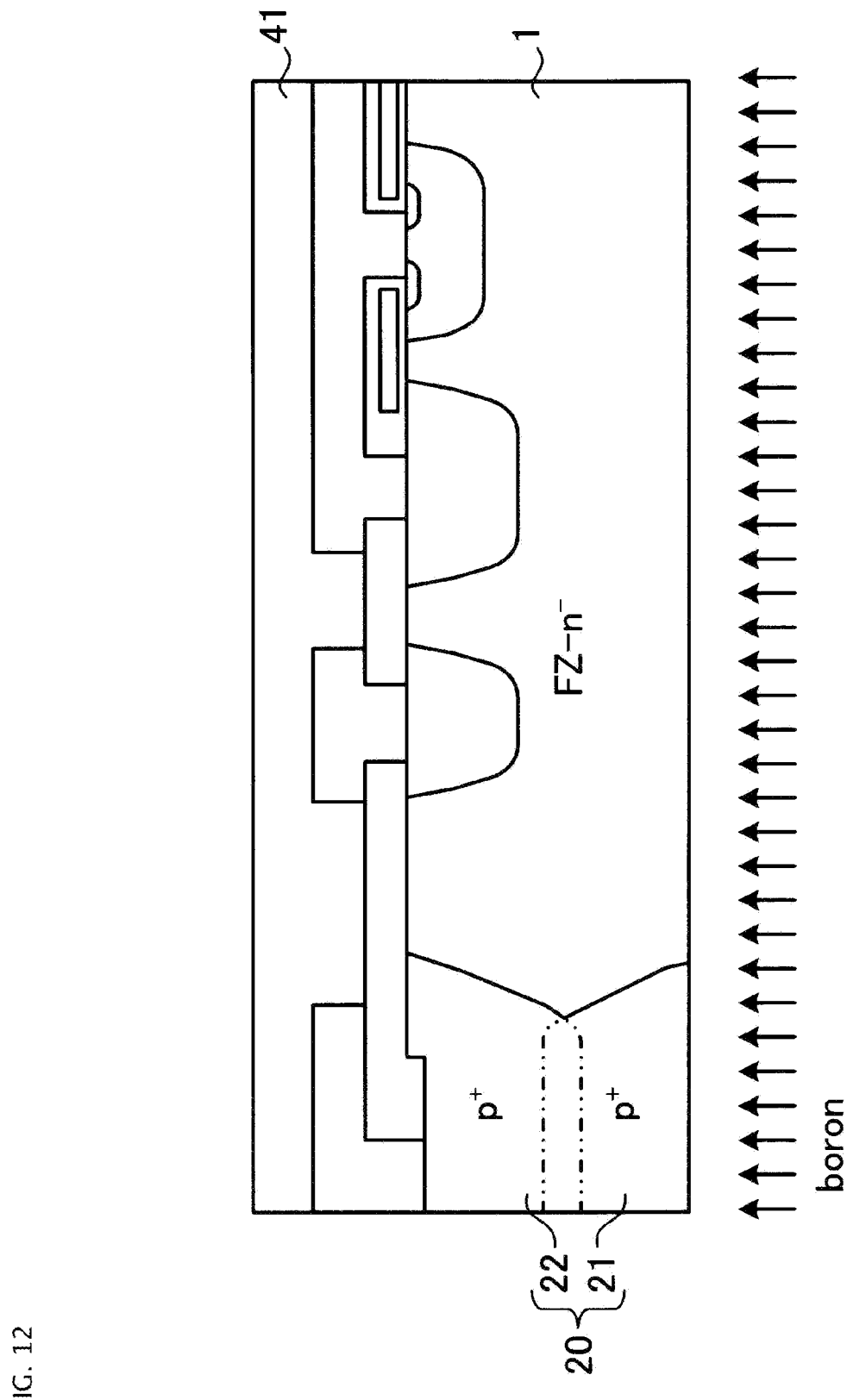
FIG. 12 is a cross-sectional view illustrating the process of manufacturing the reverse blocking IGBT according to the first embodiment.

Then, as shown in FIG. 12, boron ions are implanted into the entire first main surface of FZ wafer 1. The ion implantation dose and acceleration energy may be, for example, $5 \times 10^{13}$ $cm^{-2}$ and 100 keV, respectively. In addition, a plurality of dopant ions may be implanted into the first main surface of FZ wafer 1 at different acceleration energy levels. The ion implantation conditions may be changed in various manners depending on the design conditions of the reverse breakdown voltage IGBT.

Figure 13:
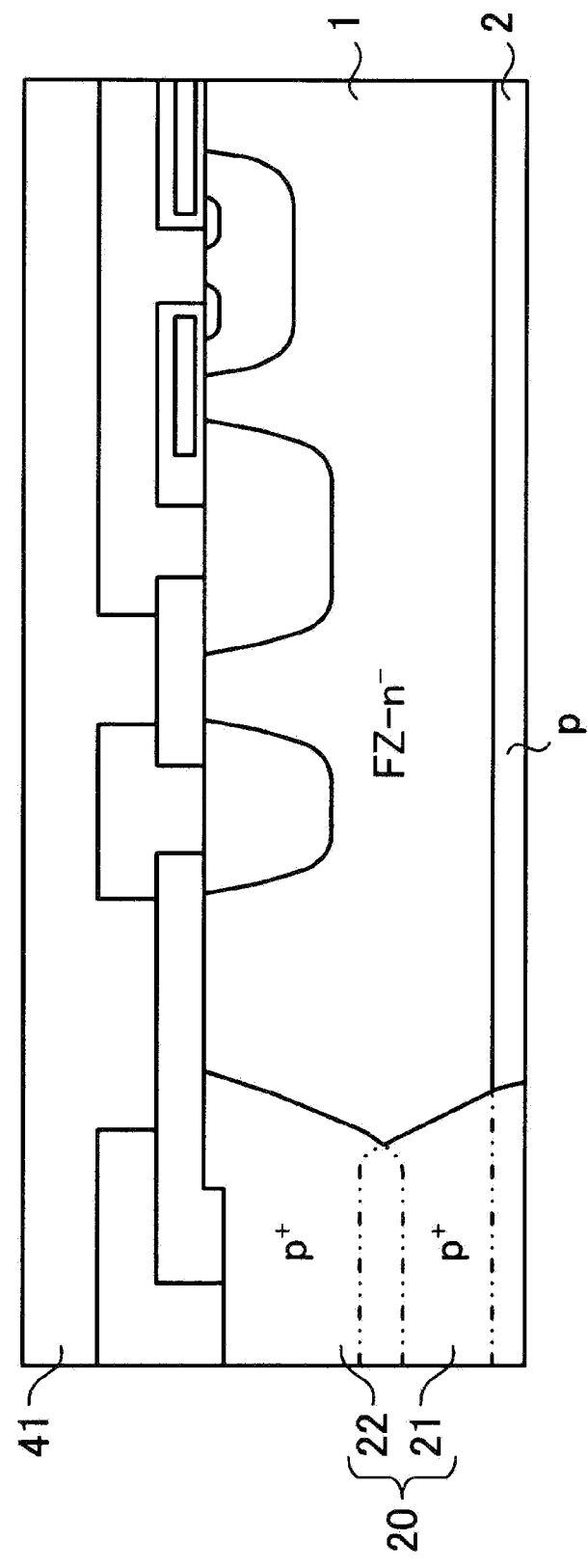
FIG. 13 is a cross-sectional view illustrating the process of manufacturing the reverse blocking IGBT according to the first embodiment.

Then, as shown in FIG. 13, laser beams are irradiated to the first main surface of FZ wafer 1 to activate, for example, boron introduced into the entire first main surface of FZ wafer 1. In this way, p collector region 2 which comes into contact with first isolation region 21 is formed on the entire first main surface of FZ wafer 1. In the heat treatment using the laser, a laser with an irradiation energy density of $1.0 \times 10^{-3}$ $J/cm^2$ or more and $2.0 \times 10^{-3}$ $J/cm^2$ or less and a photon energy higher than 1.1 eV may be used. In addition, a YAG laser with a wavelength of 532 nm may be used. The heat treatment temperature may be equal to or less than, for example, 1000° C.

Then, a metal electrode film is deposited on the first main surface of FZ wafer 1 to form collector electrode 3 which comes into contact with p collector region 2. In this way, as shown in FIG. 1, the reverse blocking IGBT is completed.

In the manufacture of the reverse blocking IGBT, before a surface blocking structure is formed on the second main surface of FZ wafer 1 and then the composite wafer is thinned, or after p collector region 2 is formed on the first main surface of FZ wafer 1, the heat treatment may be performed to adjust the lifetime of the minor carrier in the composite wafer. The lifetime of the minor carrier may be adjusted by irradiating light ions, such as electron beams or protons, to perform the heat treatment at a temperature of 300° C. or more and 400° C. or less for a time of 30 minutes or more and 90 minutes or more.

When a reverse blocking IGBT with a reverse blocking breakdown voltage of 600 V is manufactured, the composite wafer may be thinned such that the thickness of the drift region of the completed reverse blocking IGBT is, for example, equal to or greater than 80 µm and equal to or less than 100 µm. When a reverse blocking IGBT with a reverse blocking breakdown voltage of 1200 V is manufactured, the composite wafer may be thinned such that the thickness of the drift region of the completed reverse blocking IGBT is, for example, equal to or greater than 160 µm and equal to or less than 200 µm.

As described above, according to the first embodiment, first isolation region 21 and second isolation region 22 which are formed so as to be separated from each other in the composite wafer are diffused to form the continuous through silicon isolation region 20 which extends from the first main surface to the second main surface of the drift region of the completed element. Therefore, each of first isolation region 21 and second isolation region 22 may be diffused only to half the thickness of the drift region of the completed element. In this way, the diffusion time required to form through silicon isolation region 20 can be reduced to about one-half to one-third of that according the related art.

Specifically, for example, in the reverse blocking IGBT with a reverse blocking breakdown voltage of 600 V, the diffusion time may be about 50 hours when the heat treatment is performed at a temperature of 1300° C. In addition, in the reverse blocking IGBT with a reverse blocking breakdown voltage of 1200 V, the diffusion time may be about 100 hours when the heat treatment is performed at a temperature of 1300° C.

Since the diffusion time required to form the through silicon isolation region can be reduced, it is possible to prevent, for example, a reduction in breakdown voltage or an increase in leakage current in the reverse breakdown voltage IGBT due to an oxygen precipitate or an oxygen donor caused by the long diffusion time of through silicon isolation region 20 even when the drift region of the element is thick. In this way, it is possible to increase the breakdown voltage of the element. Therefore, it is possible to widen the range of the operating voltage of a power converter which is provided in the reverse breakdown voltage IGBT.

When CZ wafer 31 is directly bonded to FZ wafer 1, in the process of thermally diffusing the through silicon isolation region, it is possible to getter metal ions in which an oxygen intrinsic gettering (IG) center is contaminated in CZ wafer 31. Therefore, it is possible to improve the gettering capability of the reverse blocking IGBT manufacturing process. In this way, it is not necessary to form a special gettering layer in the FZ wafer, unlike the related art. Therefore, it is possible to reduce a wafer cost.

Figure 27:
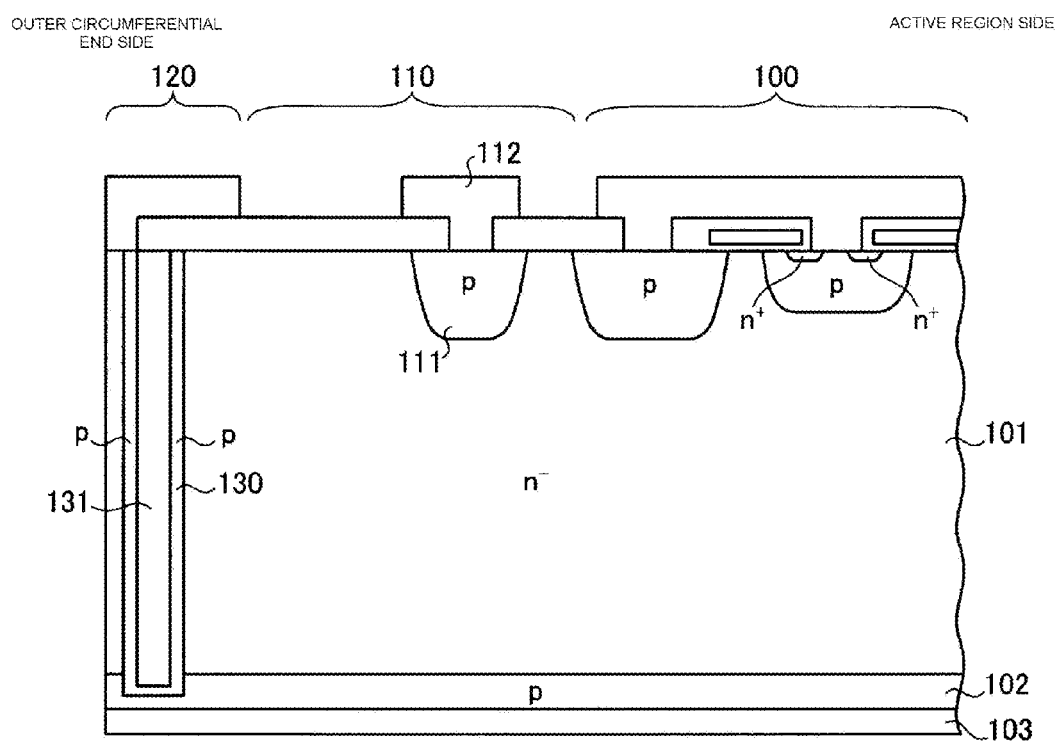
FIG. 27 is a cross-sectional view illustrating another example of the reverse blocking IGBT according to the related art.
Figure 28:
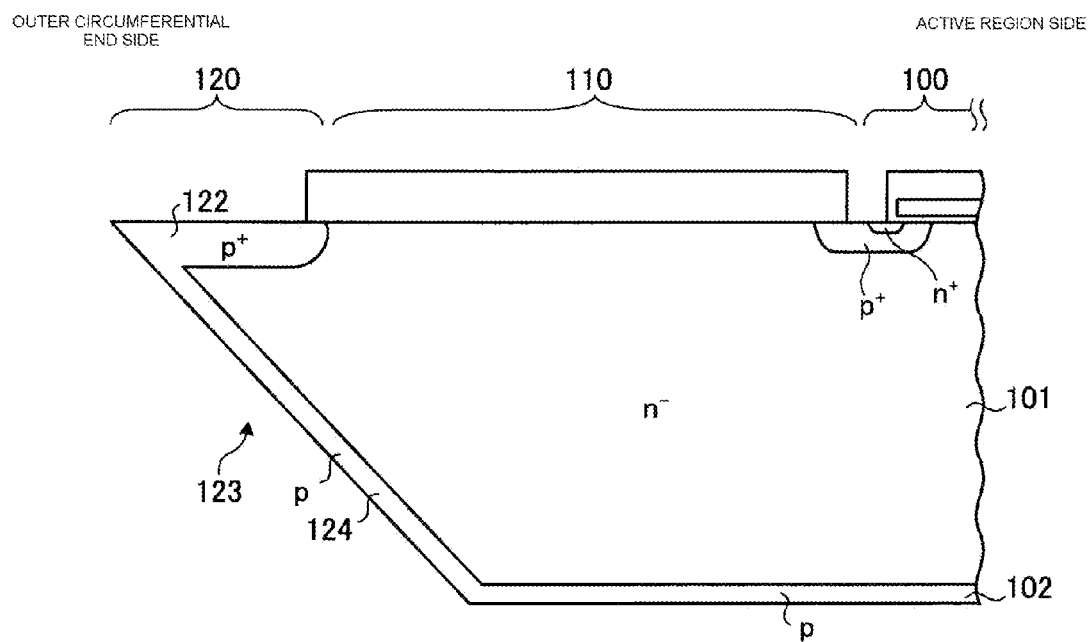
FIG. 28 is a cross-sectional view illustrating another example of the reverse blocking IGBT according to the related art.
Figure 29:
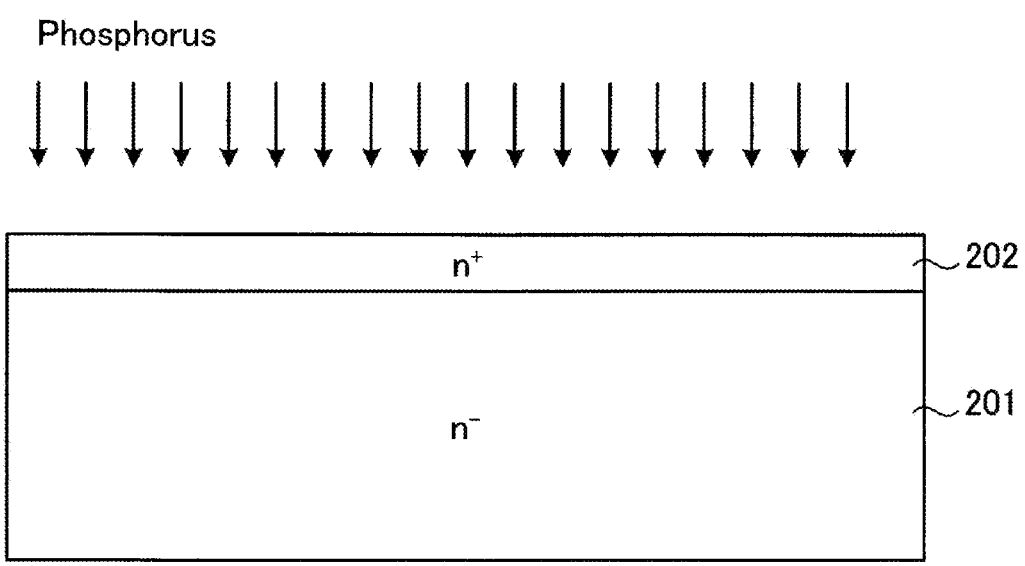
FIG. 29 is a cross-sectional view illustrating a process of manufacturing the IGBT according to the related art.
Figure 30:
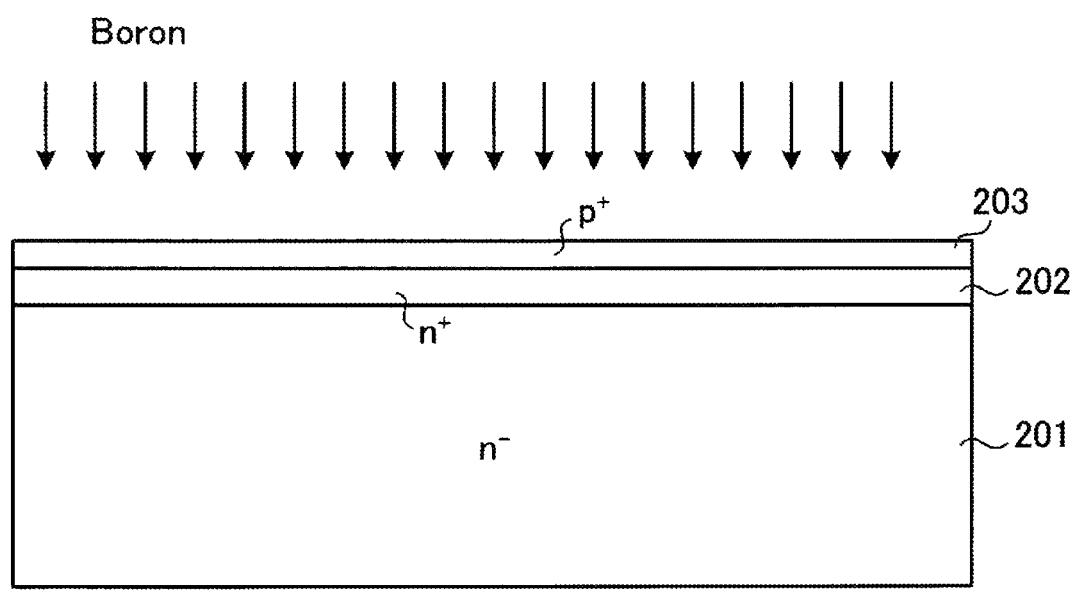
FIG. 30 is a cross-sectional view illustrating the process of manufacturing the IGBT according to the related art.
Figure 31:
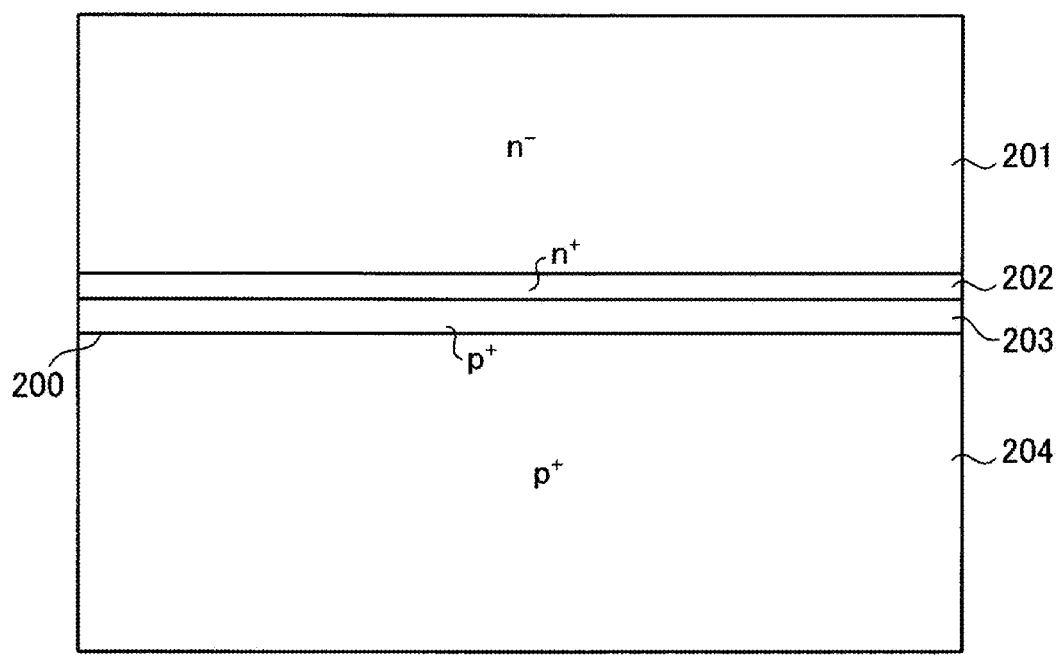
FIG. 31 is a cross-sectional view illustrating the process of manufacturing the IGBT according to the related art.
Figure 32:
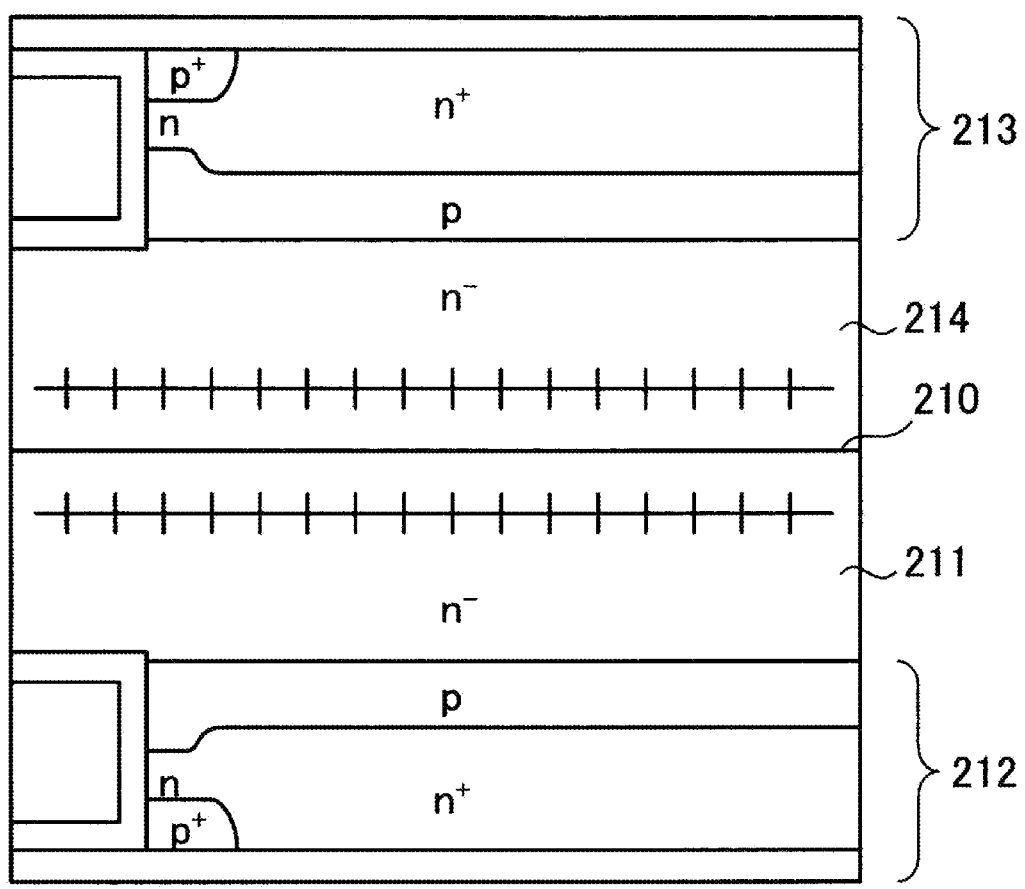
FIG. 32 is a cross-sectional view illustrating a semiconductor device formed by bonding wafers according to the related art.

Since the reverse blocking IGBT with a planar-gate-type structure can be formed, it is possible to improve the yield of the reverse blocking IGBT, as compared to when the reverse blocking IGBT (see FIG. 28) with a concave portion or the reverse blocking IGBT (see FIG. 27) with a through silicon isolation region having a trench structure according to the related art is manufactured.

In addition, it is possible to improve the controllability of ion implantation for forming through silicon isolation region 20, as compared to when the reverse blocking IGBT (see FIG. 28) with a concave portion or the reverse blocking IGBT (see FIG. 27) with a through silicon isolation region having a trench structure according to the related art is manufactured. Therefore, it is possible to reduce energy resources required to manufacture the reverse blocking IGBT.

Second Embodiment

Figure 14:
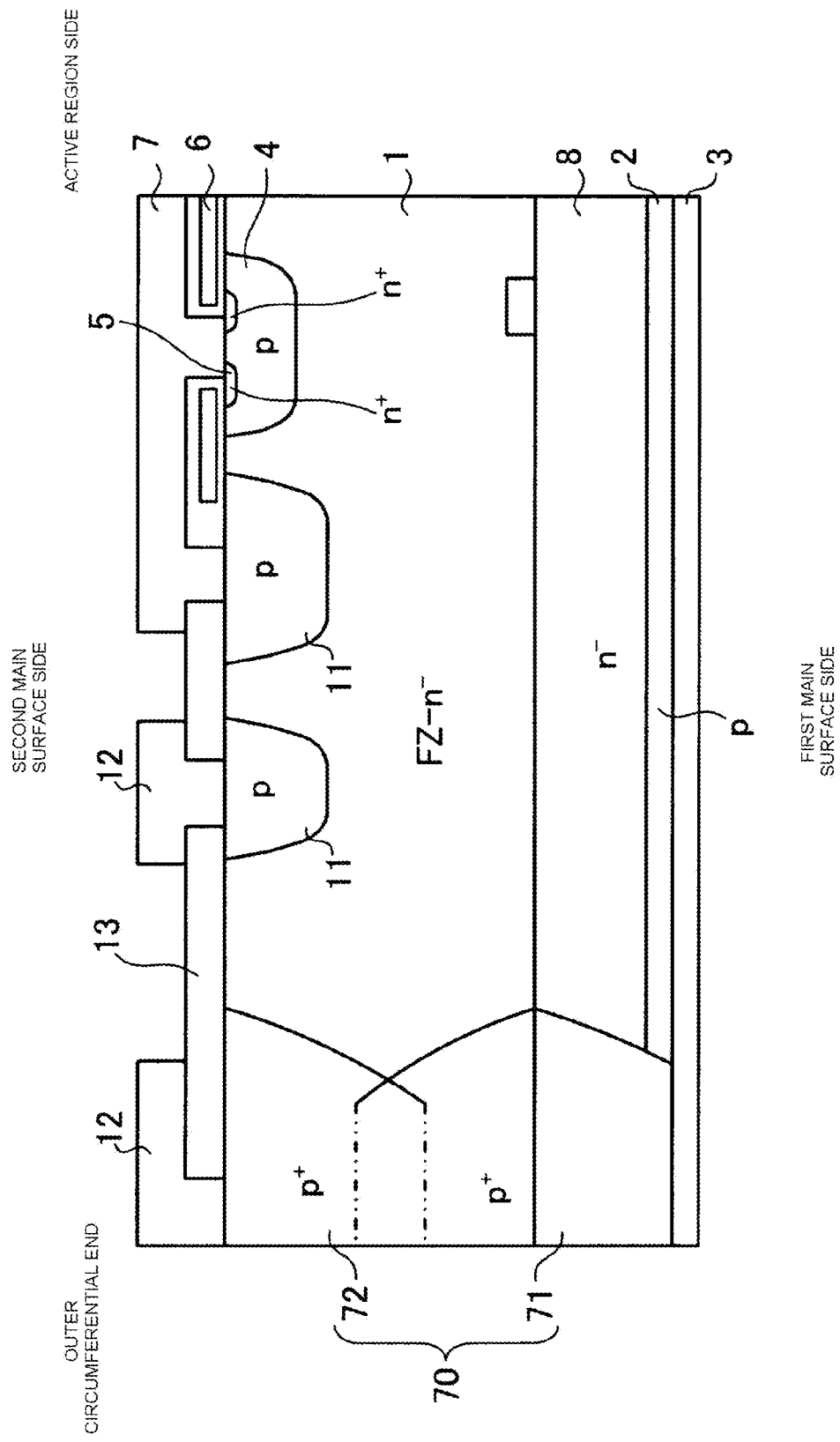
FIG. 14 is a cross-sectional view illustrating a process of manufacturing a reverse blocking IGBT according to a second embodiment.

FIG. 14 is a cross-sectional view illustrating a reverse blocking IGBT according to a second embodiment. An n⁻ epitaxial layer may be provided between the n⁻ drift region and the p collector region of the reverse blocking IGBT according to the first embodiment.

In the reverse blocking IGBT shown in FIG. 14, an n⁻ epitaxial layer 8 is provided between an n⁻ wafer (first wafer) 1 which is a drift region and p collector region 2. Through silicon isolation region 70 includes first isolation region 71 and second isolation region 72. First isolation region 71 is provided so as to extend from a surface layer of the first main surface of wafer 1 to epitaxial layer 8. In addition, first isolation region 71 comes into contact with p collector region 2 at the end close to CZ wafer 84 and comes into contact with second isolation region 72 at the end close to the second main surface of FZ wafer 1. Second isolation region 72 is provided in the surface layer of the second main surface of wafer 1. The other structures are the same as those of the reverse blocking IGBT (see FIG. 1) according to the first embodiment.

Figure 15:
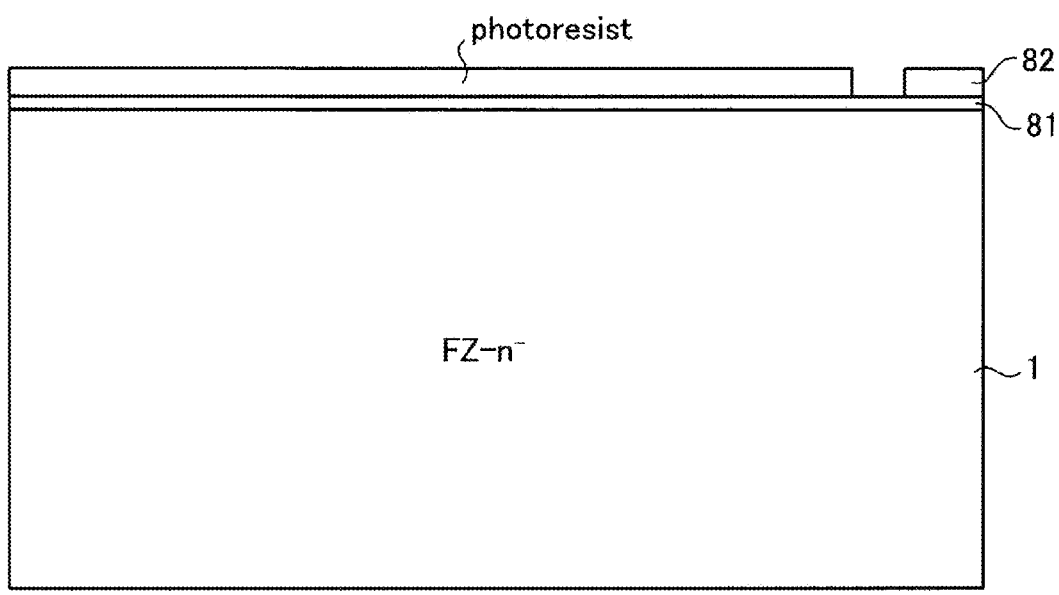
FIG. 15 is a cross-sectional view illustrating the process of manufacturing the reverse blocking IGBT according to the second embodiment.

FIGS. 15 to 25 are cross-sectional views illustrating a process of manufacturing the reverse blocking IGBT according to the second embodiment. The description of the same components (for example, processing conditions) as those in the first embodiment will not be repeated. First, as shown in FIG. 15, n-type wafer (first wafer) 1 having the first and second main surfaces which are mirror-polished is prepared. It is preferable that, for example, an FZ wafer be used as wafer 1. In the second embodiment, FZ wafer 1 is referred to as a first wafer.

Then, thermally-oxidized film 81 is grown on the first main surface of FZ wafer 1. Then, resist mask 82 having an opening for forming an alignment mark is formed on the surface of thermally-oxidized film 81 by photolithography. Then, etching is performed using resist mask 82 to remove a portion of thermally-oxidized film 81 which is exposed from the opening of resist mask 82. Then, resist mask 82 is removed.

Figure 16:
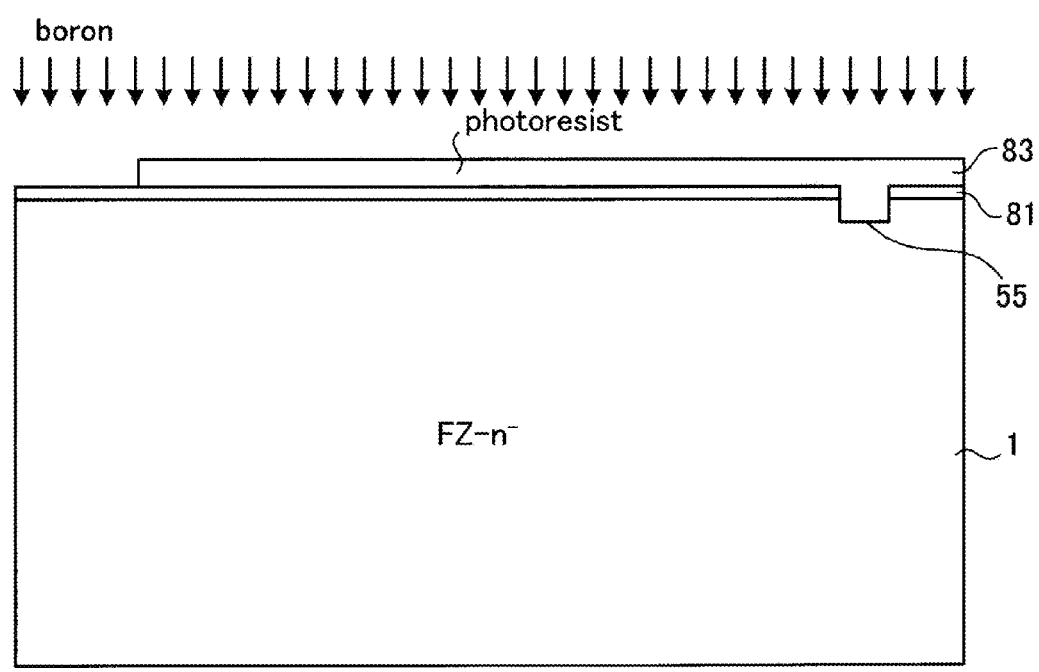
FIG. 16 is a cross-sectional view illustrating the process of manufacturing the reverse blocking IGBT according to the second embodiment.

Then, etching is performed using thermally-oxidized film 81 as a mask to remove a portion of FZ wafer 1 which is exposed from the opening of thermally-oxidized film 81. In this way, as shown in FIG. 16, alignment mark 55 is formed on the surface layer of the first main surface of FZ wafer 1.

Then, resist mask 83 having an opening for forming the first isolation region is formed on the surface of thermally-oxidized film 81 by photolithography. Then, for example, boron ions are implanted into the first main surface of FZ wafer 1 using resist mask 83. In this case, the ion implantation dose and acceleration energy may be, for example, $5 \times 10^{15}$ cm$^{-2}$ and 45 keV, respectively. In this way, first p⁺ impurity region 63 is formed as the first isolation region in a portion of the surface layer of the first main surface of FZ wafer 1 which is exposed from the opening of resist mask 83 (see FIG. 17).

Figure 17:
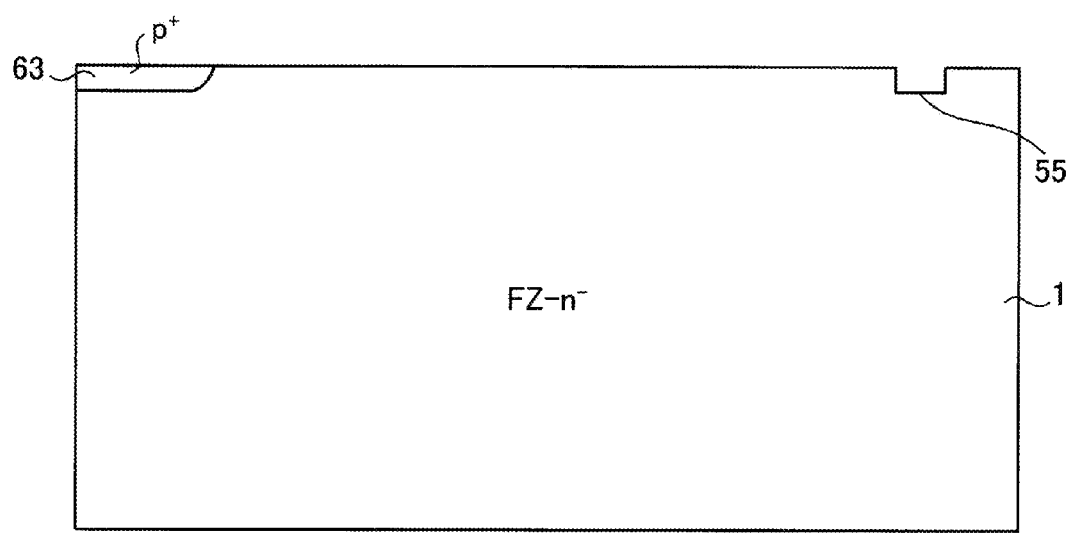
FIG. 17 is a cross-sectional view illustrating the process of manufacturing the reverse blocking IGBT according to the second embodiment.

Then, as shown in FIG. 17, resist mask 83 is removed and FZ wafer 1 is cleaned. Then, a heat treatment is performed for FZ wafer 1 to activate first impurity region 63. For example, the heat treatment is performed in an inert gas atmosphere at a temperature of 1000° C. for 30 minutes to activate first impurity region 63. In this way, ion implantation for forming first impurity region 63 makes it possible to recover crystal defects occurring in first impurity region 63. Then, the thermally-oxidized film (not shown) which is formed as a mask for forming alignment mark 55 is removed.

Figure 18:
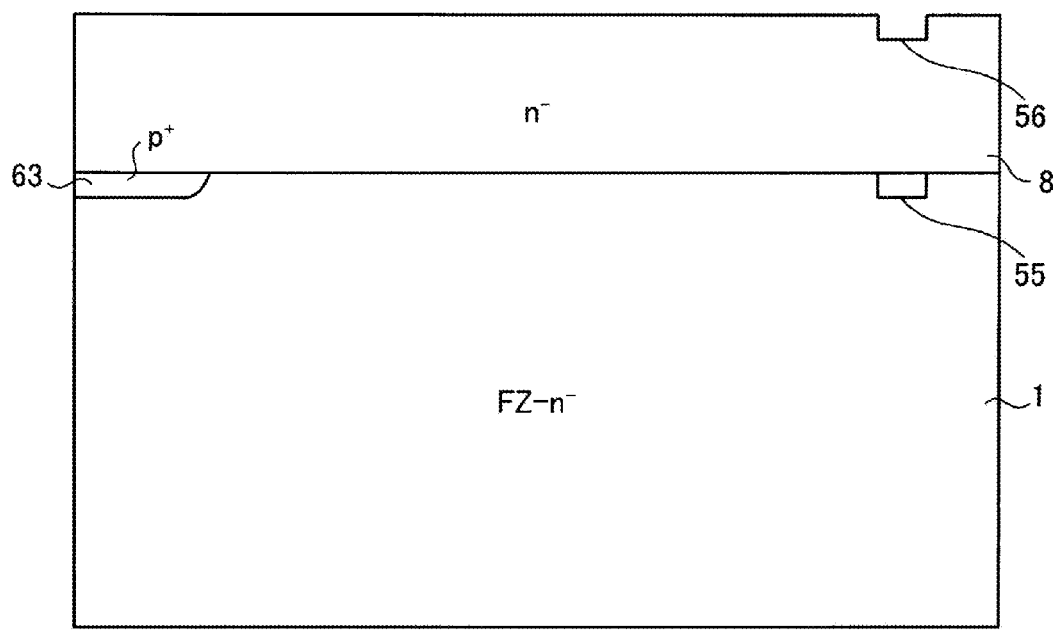
FIG. 18 is a cross-sectional view illustrating the process of manufacturing the reverse blocking IGBT according to the second embodiment.

Then, as shown in FIG. 18, n⁻ epitaxial layer 8 is grown on the first main surface of FZ wafer 1. In this case, alignment mark 55 formed in the first main surface of FZ wafer 1 is transferred to the surface of epitaxial layer 8 and alignment mark 56 is formed in the surface of epitaxial layer 8. Since crystal defects occurring in first impurity region 63 are recovered in the previous process, it is possible to ensure the crystallinity of epitaxial layer 8 which is formed on and around first impurity region 63.

Figure 19:
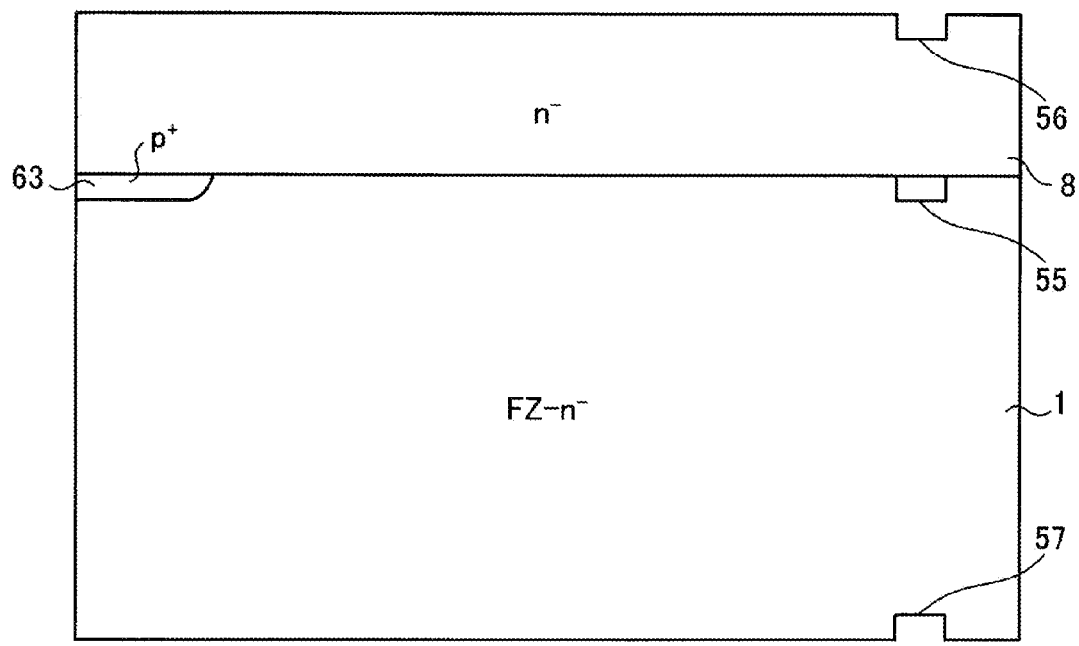
FIG. 19 is a cross-sectional view illustrating the process of manufacturing the reverse blocking IGBT according to the second embodiment.

Then, as shown in FIG. 19, alignment mark 57 is formed in the second main surface of FZ wafer 1 by the same method as that for forming alignment mark 55 so as to correspond to the position of alignment mark 56. That is, alignment mark 57 and alignment mark 56 formed in the surface of epitaxial layer 8 are symmetric, with FZ wafer 1 interposed therebetween. Then, the thermally-oxidized film (not shown) which is formed as a mask for forming alignment mark 57 is removed.

Figure 20:
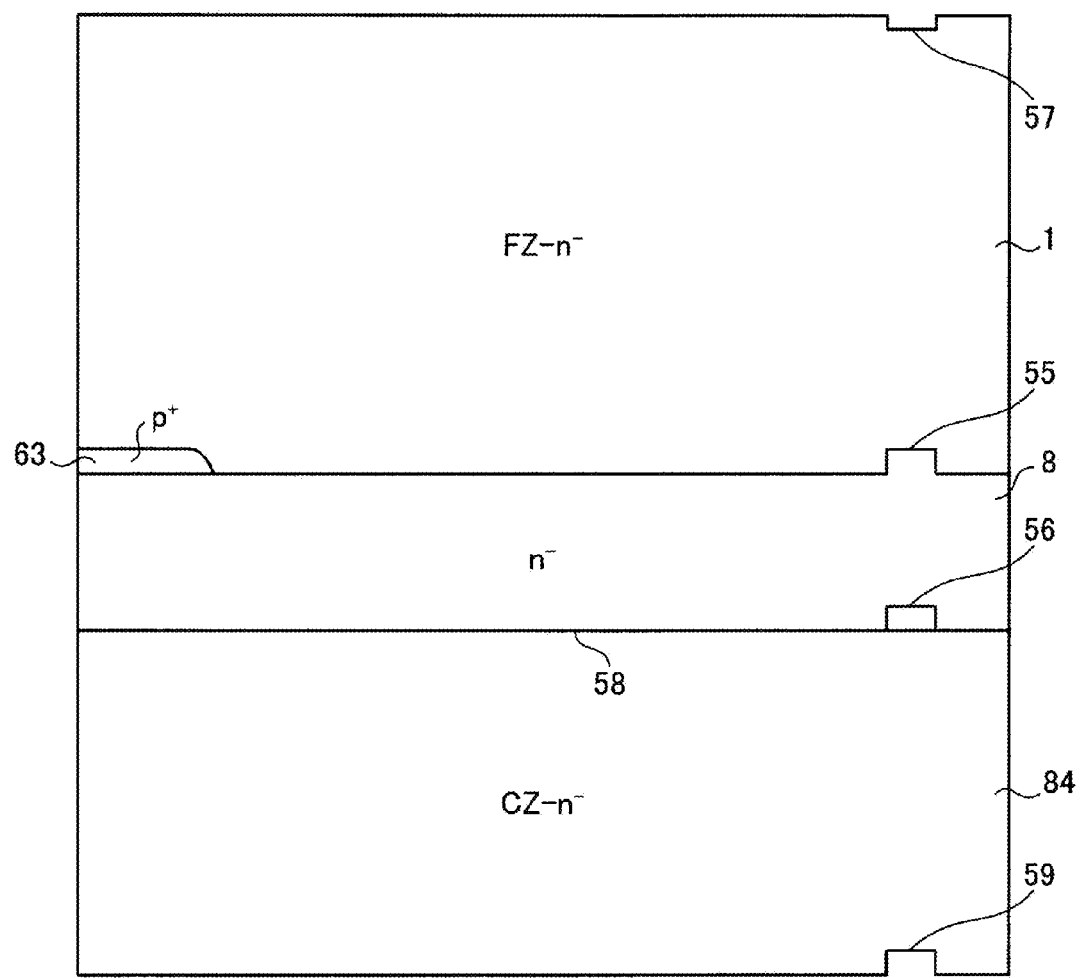
FIG. 20 is a cross-sectional view illustrating the process of manufacturing the reverse blocking IGBT according to the second embodiment.

Then, as shown in FIG. 20, n-type wafer (second wafer) 84 having the first and second main surfaces which are mirror-polished is prepared. It is preferable that a CZ wafer be used as wafer 84. In the second embodiment, CZ wafer 84 is referred to as a second wafer. Then, the surface of FZ wafer 1 close to epitaxial layer 8 and the first main surface of CZ wafer 84 are bonded to each other by the same method as that in the first embodiment. Then, CZ wafer 84 and epitaxial layer 8 are bonded to each other by an inter-molecular bond at interface 58 between CZ wafer 84 and epitaxial layer 8 by the same method as that in the first embodiment.

Then, alignment mark 59 is formed in the second main surface of CZ wafer 84 by the same method as that for forming alignment mark 55 so as to correspond to the position of alignment mark 57. That is, alignment mark 59 and alignment mark 57 which is formed in the second main surface of FZ wafer 1 are symmetric, with a composite wafer including FZ wafer 1, epitaxial layer 8, and CZ wafer 84 interposed therebetween.

Figure 21:
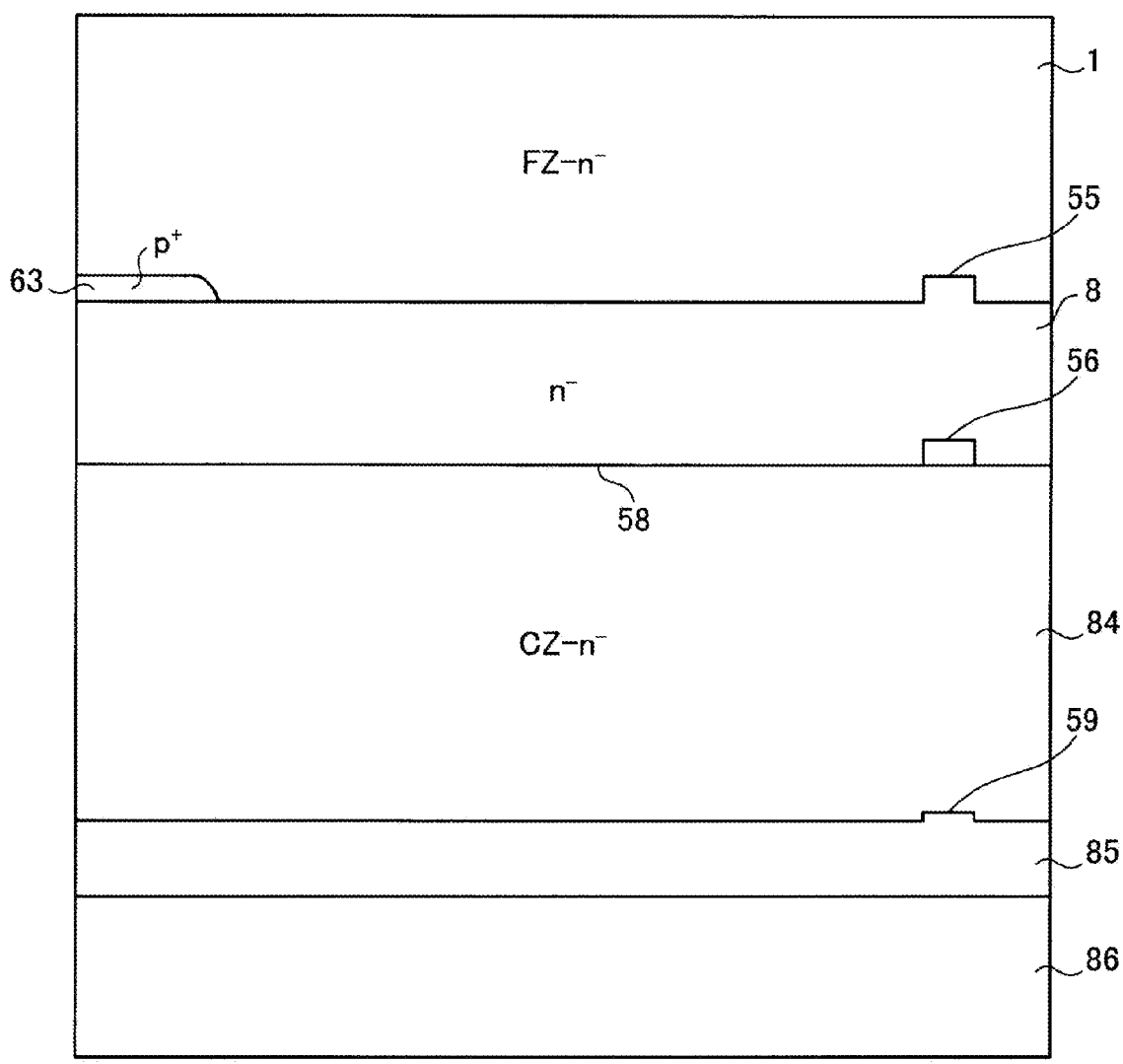
FIG. 21 is a cross-sectional view illustrating the process of manufacturing the reverse blocking IGBT according to the second embodiment.

Then, as shown in FIG. 21, similarly to the first embodiment (see FIG. 6), a screen oxide film (not shown) and resist film 85 are sequentially formed on the second main surface of CZ wafer 84 and BG tape 86 is attached to the resist film. Then, similarly to the first embodiment, only FZ wafer 1 of the composite wafer is thinned.

Figure 22:
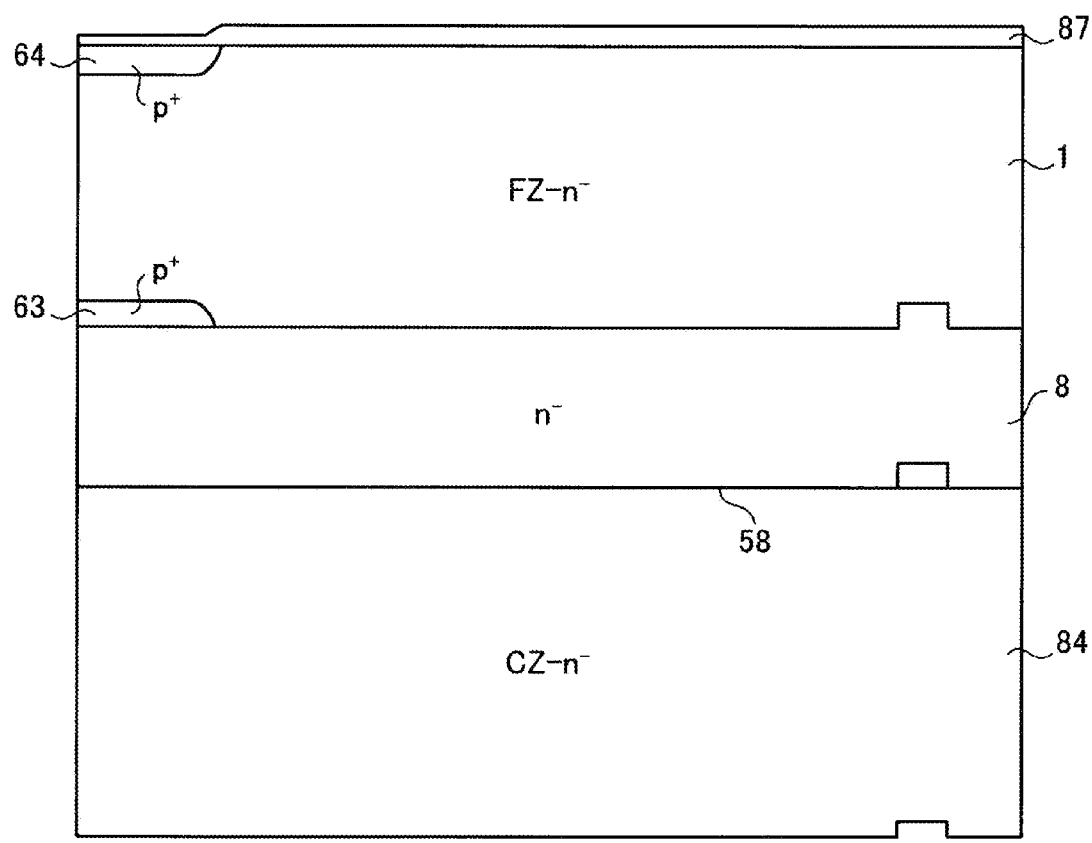
FIG. 22 is a cross-sectional view illustrating the process of manufacturing the reverse blocking IGBT according to the second embodiment.

Then, as shown in FIG. 22, similarly to the first embodiment (see FIGS. 7 and 8), ion implantation is performed using a resist mask (not shown) which is formed on thermally-oxidized film 87 and has an opening for forming the second isolation region to form second p⁺ impurity region 64 serving as the second isolation region in the surface layer of the second main surface of FZ wafer 1. Second impurity region 64 is formed in the surface layer of the second main surface of FZ wafer 1 at a position corresponding to first impurity region 63 which is provided in the first main surface of FZ wafer 1. That is, similarly to the first embodiment, for example, first impurity region 63 and second impurity region 64 are formed so as to overlap each other in the depth direction of the composite wafer at the end (outer circumferential end) of the chip after dicing.

Figure 23:
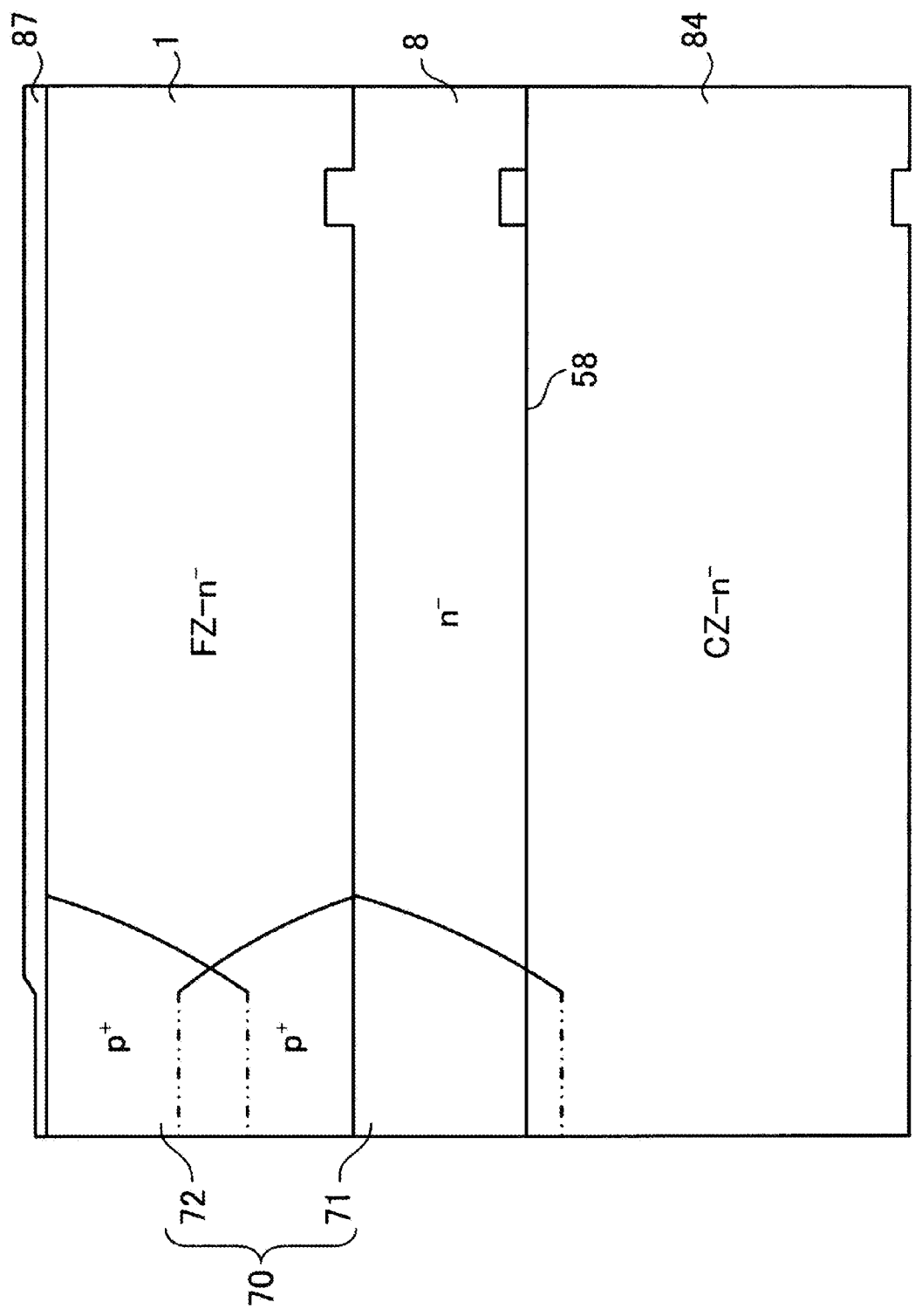
FIG. 23 is a cross-sectional view illustrating the process of manufacturing the reverse blocking IGBT according to the second embodiment.

Then, as shown in FIG. 23, similarly to the first embodiment (see FIG. 9), a heat treatment is performed for the composite wafer to diffuse first impurity region 63 and second impurity region 64. In this case, first impurity region 63 is diffused so as to pass through epitaxial layer 8 and reach CZ wafer 84. That is, first impurity region 63 is diffused over interface 58 between CZ wafer 84 and epitaxial layer 8. In this way, first isolation region 71 and second isolation region 72 are formed in FZ wafer 1. Then, through silicon isolation region 70 including first isolation region 21 and second isolation region 22 is formed across FZ wafer 1, epitaxial layer 8, and CZ wafer 84.

Figure 24:
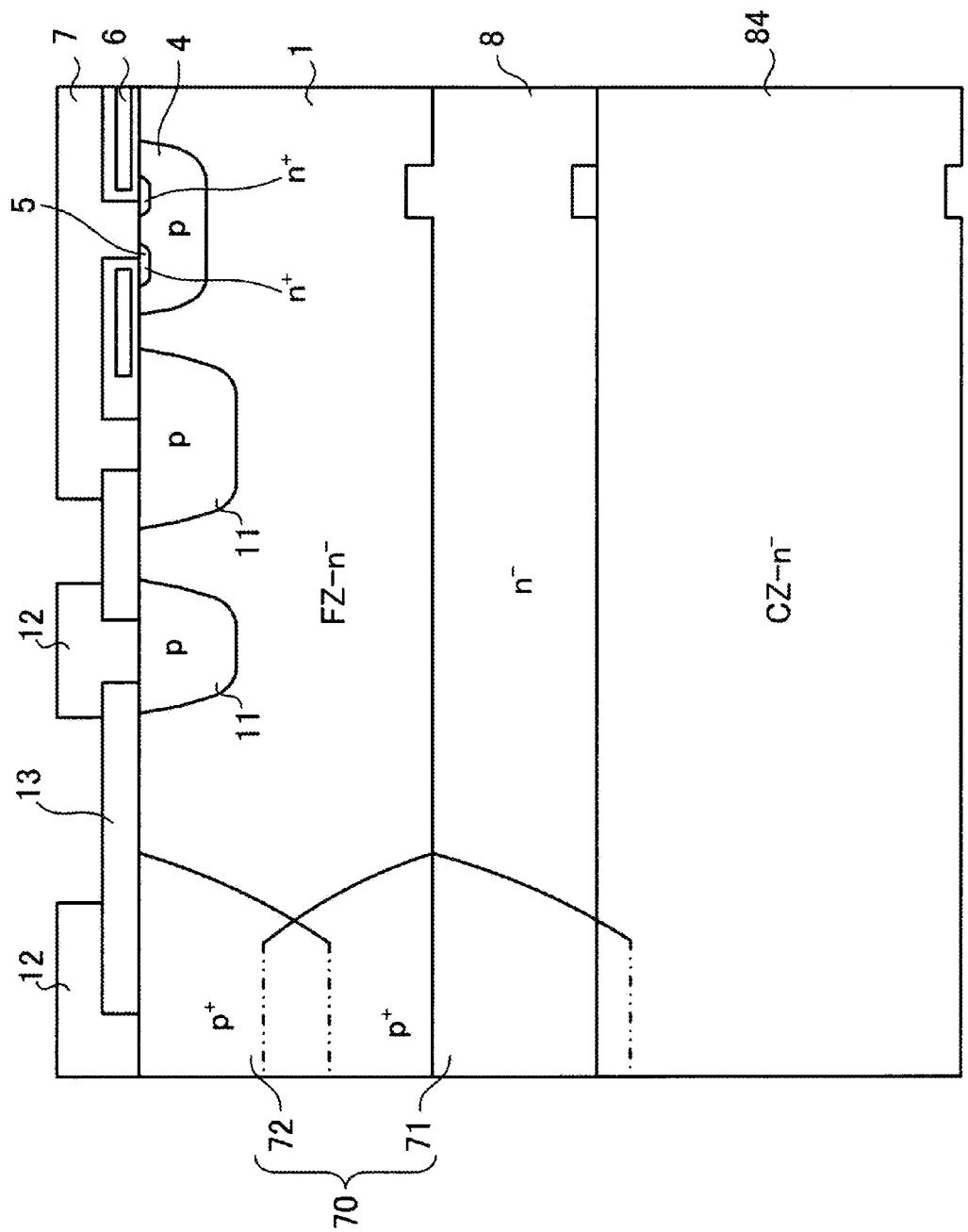
FIG. 24 is a cross-sectional view illustrating the process of manufacturing the reverse blocking IGBT according to the second embodiment.
Figure 25:
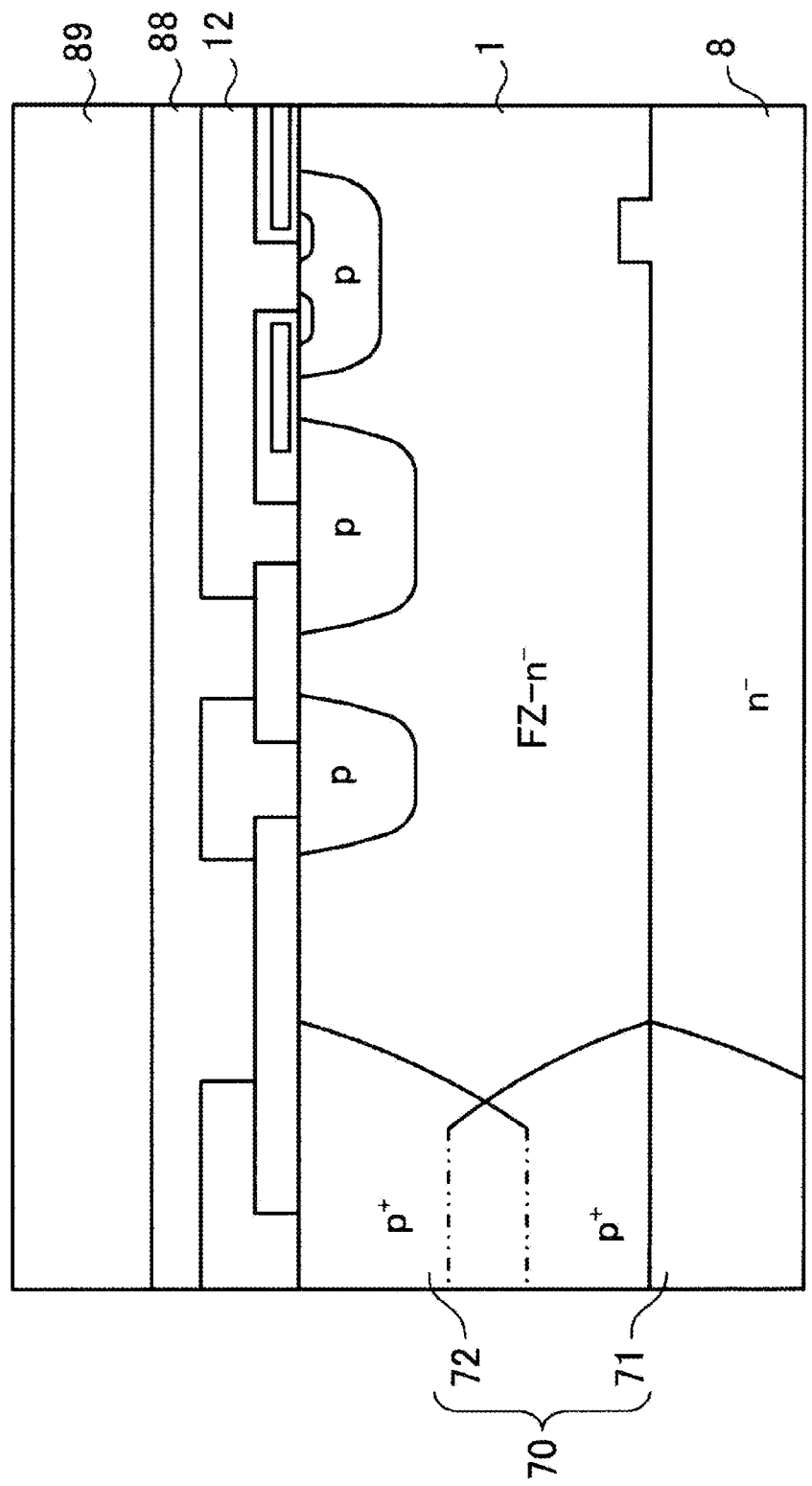
FIG. 25 is a cross-sectional view illustrating the process of manufacturing the reverse blocking IGBT according to the second embodiment.
Figure 26:
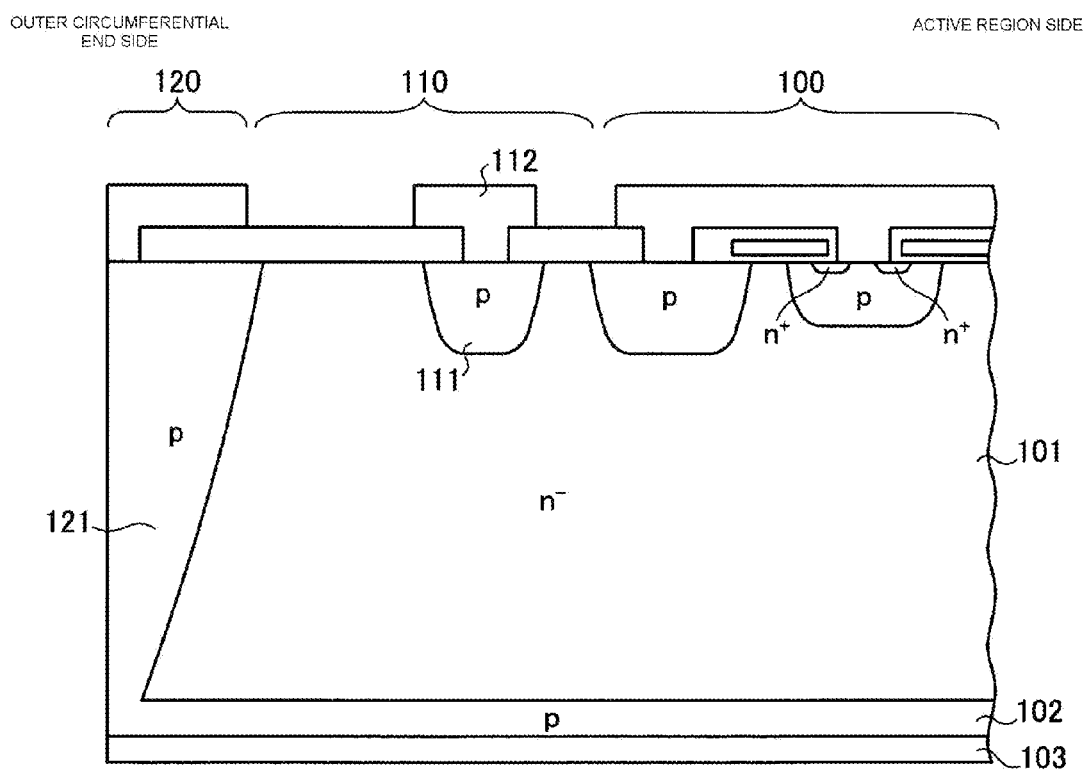
FIG. 26 is a cross-sectional view illustrating a reverse blocking IGBT according to the related art.

Then, as shown in FIG. 24, similarly to the first embodiment (see FIG. 10), for example, a surface element structure of a reverse blocking IGBT is formed on the second main surface of FZ wafer 1. Then, as shown in FIG. 25, similarly to the first embodiment (see FIG. 11), hardened resist film 88 is formed on the second main surface of FZ wafer 1 and BG tape 89 is attached to the resist film, thereby covering the surface element structure.

Then, the composite wafer is ground from the second main surface of CZ wafer 84 and is thinned. In this case, the composite wafer is ground until epitaxial layer 8 is exposed from a surface (the first main surface of FZ wafer 1) opposite to the surface on which the surface element structure of the composite wafer is formed. That is, the composite wafer is ground until interface 58 between CZ wafer 84 and epitaxial layer 8 is completely removed. In this way, CZ wafer 84 is completely removed. In addition, the through silicon isolation region 70 extends from the second main surface of FZ wafer 1 to the surface of the epitaxial layer opposite to the second main surface of FZ wafer 1. Then, the subsequent process is performed in the same manner as that in the first embodiment to complete the reverse blocking IGBT shown in FIG. 14. The other methods and processing conditions are the same as those in the first embodiment.

The composite wafer may be thinned such that the thickness of epitaxial layer 8 is one-third of the thickness of the drift region of the completed reverse blocking IGBT. For example, when a reverse blocking IGBT with a reverse blocking breakdown voltage of 1700 V is manufactured, the thickness of the drift region of the completed reverse blocking IGBT may be, for example, equal to or greater than 220 μm and equal to or less than 280 μm. Therefore, the composite wafer may be thinned such that the thickness of epitaxial layer 8 is equal to or greater than 70 μm and equal to or less than 100 μm. It is preferable that the composite wafer may be thinned such that the thickness of epitaxial layer 8 is equal to or less than 80 μm. In addition, FZ wafer 1 may be thinned such that the thickness thereof is equal to or greater than 160 μm and equal to or less than 200 μm. In this case, the through silicon isolation region 70 may be formed for the diffusion time for which the diffusion depth of first impurity region 63 and second impurity region 64 is equal to or greater than 85 μm and equal to or less than 100 μm.

As described above, according to the second embodiment, it is possible to obtain the same effect as that in the first embodiment. Since epitaxial layer 8 is formed between FZ wafer 1 and CZ wafer 84, it is possible to further reduce the diffusion time when first impurity region 63 and second impurity region 64 are diffused. Therefore, it is possible to further reduce the diffusion time required to form through silicon isolation region 70. Specifically, for example, in the reverse blocking IGBT with a reverse blocking breakdown voltage of 1700 V, the diffusion time may be about 100 hours during a heat treatment at 1300° C. Therefore, it is possible to form the through silicon isolation region for a diffusion time shorter than that in the related art even in the reverse blocking IGBT in which the drift region is thick due to an increase in breakdown voltage.

The invention is not limited to the above-described embodiments, but can be applied to a structure in which the n type and the p type are reversed. In addition, the invention is not limited to the reverse blocking IGBT, but can be applied to a semiconductor device having a diffusion layer which extends from the first main surface to the second main surface of the wafer. In the invention, the CZ wafer and the FZ wafer are used as the first and second wafers, respectively. However, the invention is not limited thereto, but various modifications of the invention can be made. For example, a wafer made of a material with gettering capability may be used instead of the CZ wafer. In the invention, the thermally-oxidized film is used to form the composite wafer. However, oxide films with the same function or other material films may be used.

As described above, the method of manufacturing the semiconductor device according to the invention is useful for switching elements provided in power converters for AC (alternating current)/AC direct conversion or power semiconductor devices used in power supplies for various types of industrial machines or vehicles.

Thus, semiconductor devices and methods for the manufacture thereof have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

| EXPLANATIONS OF LETTERS OR NUMERALS | |
| --- | --- |
| 1 | wafer (drift region) |
| 2 | p collector region |
| 3 | collector electrode |
| 4 | p base region |
| 5 | n + emitter region |
| 6 | gate electrode |
| 7 | emitter electrode |
| 11 | field limiting ring |
| 12 | conductive film |
| 13 | interlayer insulating film |
| 20 | through silicon isolation region |
| 21 | isolation region (first) |
| 22 | isolation region (second) |
| 100 | active region |
| 110 | breakdown voltage structure |
| 120 | outer circumferential end |

What is claimed is:

1. A method of manufacturing a semiconductor device comprising:

a first region forming step of selectively forming a first semiconductor region of a second conduction type in a surface layer of a first main surface of a first wafer which is a first conduction type;

a bonding step of bonding the first main surface of the first wafer and a first main surface of a second wafer which is the first conduction type after the first region forming step to form a composite wafer;

a second region forming step of selectively forming a second semiconductor region of the second conduction type in a surface layer of a second main surface of the second wafer at a position corresponding to the first semiconductor region which is formed in the first main surface of the first wafer; and a diffusion step of diffusing the first semiconductor region and the second semiconductor region such that the first semiconductor region and the second semiconductor region are continuous.

2. The method of manufacturing a semiconductor device according to claim 1, wherein, in the second region forming step, the second semiconductor region is formed so as to overlap the first semiconductor region in a depth direction of a wafer obtained by bonding the first wafer and the second wafer.

3. The method of manufacturing a semiconductor device according to claim 1 further comprising, after the diffusion step, a thinning step of removing part of the composite wafer obtained by bonding the first wafer and the second wafer from the second main surface of the first wafer to thin the composite wafer so that the second wafer is exposed.

4. The method of manufacturing a semiconductor device according to claim 1, further comprising an element structure forming step of forming a surface element structure of an insulated gate bipolar transistor on the second main surface of the second wafer between the diffusion step and the a thinning step.

5. The method of manufacturing a semiconductor device according to claim 4, wherein, in the element structure forming step, the surface element structure is formed before a metal wiring layer is formed, and in the thinning step, a protective film is provided so as to cover the surface of the surface element structure before the metal wiring layer is formed and the composite wafer obtained by bonding the first wafer and the second wafer is thinned.

6. The method of manufacturing a semiconductor device according to claim 5, further comprising, after the thinning step, a third region forming step of forming a third semiconductor region of the second conduction type in the first main surface of the second wafer so as to come into contact with the first semiconductor region.

7. The method of manufacturing a semiconductor device according to claim 6, wherein, in the third region forming step, second-conduction-type impurity ions are implanted into the first main surface of the second wafer and a heat treatment is performed at a temperature of 1000° C. or less to form the third semiconductor region.

8. The method of manufacturing a semiconductor device according to claim 4, wherein, between the element structure forming step and the thinning step, light ion irradiation and a heat treatment are performed to adjust a lifetime of a minor carrier in the composite wafer obtained by bonding the first wafer and the second wafer.

9. The method of manufacturing a semiconductor device according to claim 4, wherein, between the element structure forming step and the thinning step, light ion irradiation and a heat treatment which is performed at a temperature of 300° C. or more and 400° C. or less for a time of 30 minutes or more and 90 minutes or less are performed to adjust a lifetime of a minor carrier in the composite wafer obtained by bonding the first wafer and the second wafer.

10. The method of manufacturing a semiconductor device according to claim 1, further comprising, after a thinning step, a third region forming step of forming a third semiconductor region of the second conduction type in the first main surface of the second wafer so as to come into contact with the first semiconductor region.

11. The method of manufacturing a semiconductor device according to claim 10, wherein, after the third region forming step, light ion irradiation and a heat treatment are performed to adjust a carrier lifetime of a minor carrier in the composite wafer obtained by bonding the first wafer and the second wafer.

12. The method of manufacturing a semiconductor device according to claim 10, wherein, after the third region forming step, light ion irradiation and a heat treatment which is performed at a temperature of 300° C. or more and 400° C. or less for a time of 30 minutes or more and 90 minutes or less are performed to adjust a carrier lifetime of a minor carrier in the composite wafer obtained by bonding the first wafer and the second wafer.

13. The method of manufacturing a semiconductor device according to claim 10, wherein, in the third region forming step, second-conduction-type impurity ions are implanted into the first main surface of the second wafer and a heat treatment is performed at a temperature of 1000° C. or less to form the third semiconductor region.

14. The method of manufacturing a semiconductor device according to claim 10, wherein, in the third region forming step, second-conduction-type impurity ions are implanted into the first main surface of the second wafer and a laser beam with an irradiation energy density of $1.0 \times 10^{-3}$ J/cm$^2$ or more and $2.0 \times 10^{-3}$ J/cm$^2$ or less and a photon energy greater than 1.1 eV is irradiated to the first main surface of the second wafer to form the third semiconductor region.

15. The method of manufacturing a semiconductor device according to claim 1, wherein, in the bonding step, the termination of a silicon bond in the first main surface of the first wafer and the first main surface of the second wafer is replaced with a hydroxyl group and the first main surface of the first wafer and the first main surface of the second wafer are bonded to each other.

16. The method of manufacturing a semiconductor device according to claim 1, wherein, in the bonding step, the first main surface of the first wafer and the first main surface of the second wafer are bonded to each other and a heat treatment is performed at a temperature of 900° C. or more and 1200° C. or less for a time of 30 minutes or more and 120 minutes or less in an inert gas atmosphere to bond the first main surface of the first wafer and the first main surface of the second wafer using a single bond between silicon atoms in the surfaces of the wafers.

17. The method of manufacturing a semiconductor device according to claim 1, further comprising, between the bonding step and the second region forming step, a step of thinning the second wafer from the second main surface.

18. The method of manufacturing a semiconductor device according to claim 1, wherein a silicon wafer manufactured by a Czochralski method is used as the first wafer.

19. The method of manufacturing a semiconductor device according to claim 1, wherein a silicon wafer manufactured by a floating zone method is used as the second wafer.

* * * * *